US012563861B2

(12) United States Patent
Lee et al.

(10) Patent No.: US 12,563,861 B2
(45) Date of Patent: Feb. 24, 2026

(54) PHOTODIODE ELEMENT AND SENSOR AND ELECTRONIC DEVICE

(71) Applicant: Samsung Electronics Co., Ltd., Suwon-si (KR)

(72) Inventors: Gae Hwang Lee, Seongnam-si (KR); Hyun Bum Kang, Yongin-si (KR); Youngjun Yun, Seongnam-si (KR); Jong Won Chung, Hwaseong-si (KR)

(73) Assignee: Samsung Electronics Co., Ltd., Gyeonggi-Do (KR)

( * ) Notice: Subject to any disclaimer, the term of this patent is extended or adjusted under 35 U.S.C. 154(b) by 807 days.

(21) Appl. No.: 17/857,532

(22) Filed: Jul. 5, 2022

(65) Prior Publication Data

US 2023/0103445 A1     Apr. 6, 2023

(30) Foreign Application Priority Data

Sep. 24, 2021    (KR) ........................ 10-2021-0126537

(51) Int. Cl.
 H10F 77/40        (2025.01)
 H10F 30/22        (2025.01)
        (Continued)
(52) U.S. Cl.
 CPC ........... H10F 77/496 (2025.01); H10F 30/22 (2025.01); H10F 55/18 (2025.01); H10K 30/60 (2023.02); H10K 39/34 (2023.02); H10K 65/00 (2023.02)
(58) Field of Classification Search
 CPC ........ H10F 77/496; H10F 30/22; H10F 55/18; H10K 30/60; H10K 39/34; H10K 65/00
 See application file for complete search history.

(56) References Cited

U.S. PATENT DOCUMENTS

2005/0236556 A1* 10/2005 Sargent ................ C09K 11/883
                                                    250/214.1
2018/0122869 A1*  5/2018 Jiang ................. G02F 1/133617
                    (Continued)

FOREIGN PATENT DOCUMENTS

JP          3698215 B2      9/2005
JP       2006-251555 A      9/2016
KR      10-1695260 B1       1/2017

OTHER PUBLICATIONS

Meiso Yokoyama et al, "Enhancing the Efficiency and Contrast Ratio of White Organic Light-Emitting Diode Using Energy-Recyclable Photovoltaic Cells" Feb. 27, 2012, Japanese Journal of Applied Physics 51, pp. 032102-1-032102-6 (Year: 2012).*

(Continued)

*Primary Examiner* — David Vu
*Assistant Examiner* — Brandon C Fox
(74) *Attorney, Agent, or Firm* — Harness, Dickey & Pierce, P.L.C.

(57)             ABSTRACT

Disclosed are a photodiode element, and a sensor and an electronic device including the same. The photodiode element includes a first electrode, a second electrode facing the first electrode, a photoelectric conversion layer between the first electrode and the second electrode and having an absorption spectrum in a first wavelength spectrum, a light-emitting layer between the photoelectric conversion layer and the second electrode and having an emission peak wavelength belonging to the first wavelength spectrum, and a first charge transport layer between the photoelectric conversion layer and the light-emitting layer.

36 Claims, 16 Drawing Sheets

100

(51) Int. Cl.

| | |
|---|---|
| *H10F 55/00* | (2025.01) |
| *H10K 30/60* | (2023.01) |
| *H10K 39/34* | (2023.01) |
| *H10K 65/00* | (2023.01) |

(56) References Cited

U.S. PATENT DOCUMENTS

| | | | | |
|---|---|---|---|---|
| 2018/0331313 | A1* | 11/2018 | Xu | H10K 50/80 |
| 2019/0363269 | A1* | 11/2019 | Leem | H10K 30/57 |
| 2021/0005668 | A1* | 1/2021 | Trefonas, III | H10K 50/115 |

OTHER PUBLICATIONS

Extended European Search Report dated Dec. 19, 2022 issued in European Patent Application No. 22182142.4-1211.

Yokoyama, et al. "Enhancing the Efficiency and Contrast Ration of White Organic Light-Emitting Diode Using Energy-Recyclable Photovoltaic Cells," Japanese Journal of Applied Physics, XP-001576481, No. 51, pp. 032102-032102-6 (2012).

Hoshi, et al. "Electronic absorption and emission spectra of A1q3 in solution with special attention to a delayed fluorescence," Journal of Luminescence, ScienceDirect, XP022659962, No. 128, pp. 1353-1358 (2008).

Lv, et al. "Organic near-infrared upconversion devices: Design principles and operation mechanisms," Organic Electronics, XP093006162, No. 31, pp. 258-265 (2016).

Zhou, et al. "Solution-processed upconversion photodetectors based on quantum dots," Nature Electronics, XP093006214, vol. 3, pp. 251-258, (2020).

Hiroki Tachibana, et al. "tunable Full-Color Electroluminescence from All-Organic Optical Upconversion Devices by Near-Infrared Sensing", ACS Publications, ACS Photonics, vol. 4, pp. 223-227 (2017).

* cited by examiner

<u>100</u>

10    60    30    50    40    70    20

10    60    30    50    40    70    20

20      70      40      50      30      60      10

20      70      40      50      30      60      10

<u>300</u>

<u>300</u>

200

FWHM3

Emission Spectrum

Wavelength (nm)

$\lambda_{peak,led}$
W3

100 (30)

FWHM1

Absorption Spectrum

Wavelength (nm)

$\lambda_{peak,A}$
W1

100 (40)

FWHM2

Emission Spectrum

Wavelength (nm)

$\lambda_{peak,el}$
W2

PHOTODIODE ELEMENT AND SENSOR AND ELECTRONIC DEVICE

CROSS-REFERENCE TO RELATED APPLICATION

This application claims priority to and the benefit of Korean Patent Application No. 10-2021-0126537 filed in the Korean Intellectual Property Office on Sep. 24, 2021, the entire contents of which are incorporated herein by reference.

BACKGROUND

A photodiode element, a sensor, and/or an electronic device are disclosed.

A photodetector is or may include a device that converts an optical signal into an electrical signal, and includes one or more of a photoconductor, a phototransistor, and a photodiode. The photoconductor may be configured to detect a change in current through a change in resistance according to light intensity. The phototransistor may include a light absorbing material in or within a semiconductor channel and may be configured to detect a change in current of the transistor according to an amount of light. The photodiode may separate light absorbed in the photoelectric conversion layer including the light absorbing material into electrons and holes to detect a change in current. Among them, photodiodes have good detectivity due to low dark current, and thus are being applied to various sensors.

However, since the photodiode generates electric charges from absorbed light, it cannot generate more current than the number of incident photons. Therefore, the efficiency of the photodiode is difficult to be greater than about 100%.

SUMMARY

Some example embodiments provide a photodiode element capable of overcoming or at least partially overcoming a limitation of light efficiency while maintaining an advantage of high detectivity due to a low dark current.

Alternatively or additionally, some example embodiments provide a sensor including the photodiode element.

Alternatively or additionally, some example embodiments provide an electronic device including the photodiode element or the sensor.

According to some example embodiments, a photodiode element includes a first electrode, a second electrode facing the first electrode, a photoelectric conversion layer between the first electrode and the second electrode and having an absorption spectrum corresponding to a first wavelength spectrum, a light-emitting layer between the photoelectric conversion layer and the second electrode and having an emission peak wavelength within the first wavelength spectrum, and a first charge transport layer between the photoelectric conversion layer and the light-emitting layer.

The light-emitting layer may have an emission spectrum belonging to a second wavelength spectrum, and the second wavelength spectrum may be overlapped with at least a portion of the first wavelength spectrum.

A measure of dispersion, such as a full width at half maximum (FWHM) of the emission spectrum of the light-emitting layer may be narrower than a full width at half maximum (FWHM) of the absorption spectrum of the photoelectric conversion layer.

2

The FWHM of the emission spectrum of the light-emitting layer may be about 0.10 to about 0.95 of the FWHM of the absorption spectrum of the photoelectric conversion layer.

The second wavelength spectrum may belong to, e.g. may be within, the first wavelength spectrum.

The first wavelength spectrum and the second wavelength spectrum may each belong to a visible light wavelength spectrum.

The first wavelength spectrum and the second wavelength spectrum may each belong to an infrared wavelength spectrum.

An absorbance of the absorption spectrum at the emission peak wavelength may be about 50% to about 100% of a large, e.g. of a local or global maximum absorbance of the absorption spectrum.

The photodiode element may further include a second charge transport layer between the first electrode and the photoelectric conversion layer, and a third charge transport layer between the second electrode and the light-emitting layer.

The first charge transport layer may be or may include a hole transport layer, and the third charge transport layer may be or may include an electron transport layer.

The second charge transport layer may be or may include a hole transport layer or an electron transport layer.

The first electrode may be or may correspond to an anode and the second electrode may be or may correspond to a cathode.

The first charge transport layer may be or may include an electron transport layer, and the third charge transport layer may be or may include a hole transport layer.

The second charge transport layer may be or may include a hole transport layer or an electron transport layer.

The first electrode may be or may correspond to a cathode and the second electrode may be or may correspond to an anode.

The first electrode may be or may correspond to a transparent electrode or a semi-transmissive electrode, and the second electrode may be or may correspond to a transparent electrode or a reflective electrode.

An external quantum efficiency of the photodiode element may be greater than about 100%.

As a bias between the first electrode and the second electrode increases, the external quantum efficiency of the photodiode element may increase.

According to some example embodiments, a photodiode element includes a first electrode, a second electrode facing the first electrode, a photoelectric conversion layer between the first electrode and the second electrode and including a light absorbing material, and a light-emitting layer between the photoelectric conversion layer and the second electrodes and including a light-emitting material. The photodiode element is configured such that as a bias between the first electrode and the second electrode increases, an external quantum efficiency of the photodiode element increases, and the external quantum efficiency of the photodiode element is greater than about 100%.

The photodiode may be configured such that electric charges that are photo-generated in the photoelectric conversion layer may move to the light-emitting layer according to an application of a bias between the first electrode and the second electrode to perform electroluminescence, and the photoelectric conversion layer may be configured to absorb the light electroluminescent from the light-emitting layer to convert the absorbed light into an electrical signal.

An emission spectrum of the light electroluminescent from the light-emitting layer and an absorption spectrum of the photoelectric conversion layer may be at least partially overlapped with each other, and a first measure of dispersion such as a FWHM of the emission spectrum may be narrower than a second measure of dispersion such as a FWHM of the absorption spectrum of the photoelectric conversion layer.

The photodiode element may further include a first charge transport layer between the photoelectric conversion layer and the light-emitting layer.

The photodiode element may further include a second charge transport layer between the first electrode and the photoelectric conversion layer, and a third charge transport layer between the second electrode and the light-emitting layer.

According to some example embodiments, a sensor including the photodiode element is provided.

The sensor may be an optical sensor, an image sensor, an infrared sensor, an ultraviolet sensor, or a combination thereof.

According to some example embodiments, an electronic device including the photodiode element or the sensor is provided.

According to some example embodiments, a method of operating the photodiode element includes a first process of absorbing light incident through the first electrode in the photoelectric conversion layer to generate electron-hole pairs; a second process of moving a first electric charge, which is one of electrons or holes separated from the electron-hole pairs by a bias between the first electrode and the second electrode, toward the first electrode and moving a second electric charge, which is the other of electrons or holes separated from the electron-hole pairs, toward the light-emitting layer to be combined with the first electric charge injected from the second electrode to emit light; and a third process of absorbing light emitted from the light-emitting layer in the photoelectric conversion layer to additionally generate electron-hole pairs.

In the method of operating the photodiode element, the second process and the third process may be repeated two or more times.

The current generated by the photodiode element may be greater than the number of photons of light incident through the first electrode.

An external quantum efficiency (EQE) of more than 100% may be realized by overcoming the limit of light efficiency while having the advantage of high detectivity due to the low dark current of the photodiode element.

According to some example embodiments, a photodiode may include a photoelectric conversion layer, an absorption spectrum of the photoelectric conversion layer corresponding to a first wavelength spectrum having a first measure of statistical dispersion, and a light-emitting layer on the photoelectric conversion layer, an emission spectrum of the light-emitting layer corresponding to a second wavelength spectrum having a second measure of dispersion, the second measure of statistical dispersion less than the first measure of statistical dispersion.

The photodiode may be capable of operating and/or or be configured to operate such that a number of charges generated by the photoelectric conversion layer is more than a number of photons incident to the photoelectric conversion layer.

The first measure of statistical dispersion may be a first full width at half maximum, and the second measure of statistical dispersion may be a second full width at half maximum.

The photodiode may include a first electrode, and a second electrode facing the first electrode. The photoelectric conversion layer and the light-emitting layer may be between the first electrode and the second electrode.

One of the first electrode and the second electrode includes a transparent material, and the other of the first electrode and the second electrode includes a reflective material.

BRIEF DESCRIPTION OF THE DRAWINGS

FIG. 18 is a graph showing EQE Gain according to bias of the photodiode elements according to Examples 2 to 4.

Figure 1:
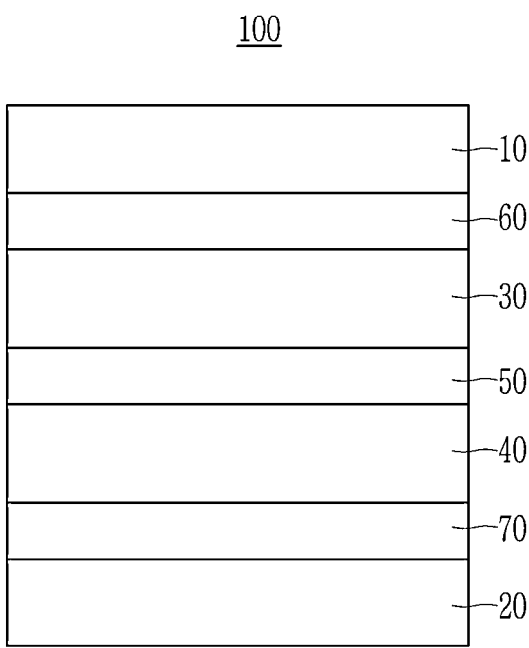
FIG. 1 is a cross-sectional view showing an example of a photodiode element according to some example embodiments.

DETAILED DESCRIPTION OF VARIOUS
EXAMPLE EMBODIMENTS

Hereinafter, some example embodiments of the present disclosure will be described in detail so that a person of ordinary skill in the art would understand the same. However, this disclosure may be embodied in many different forms and is not to be construed as limited to example embodiments set forth herein.

In the drawings, the thickness of layers, films, panels, regions, etc., are exaggerated for clarity. It will be understood that when an element such as a layer, film, region, or substrate is referred to as being "on" another element, it may be directly on the other element or intervening elements may also be present. In contrast, when an element is referred to as being "directly on" another element, there are no intervening elements present.

In the drawings, parts having no relationship with the description are omitted for clarity, and the same or similar constituent elements are indicated by the same reference numeral throughout the specification.

Hereinafter, "lower portion" and "upper portion" are for convenience of description and do not limit the positional relationship.

Hereinafter, the upper portion of the photodiode element or sensor will be described as a light-receiving side, but this is for convenience of description and does not limit the positional relationship.

As used herein, when specific definition is not otherwise provided, the "substituted" refers to replacement of a hydrogen of a compound by a halogen atom, a hydroxy group, an alkoxy group, a nitro group, a cyano group, an amino group, an azido group, an amidino group, a hydrazino group, a hydrazono group, a carbonyl group, a carbamyl group, a thiol group, an ester group, a carboxyl group or a salt thereof, a sulfonic acid group or a salt thereof, a phosphoric acid or a salt thereof, a silyl group, a C1 to C20 alkyl group, a C2 to C20 alkenyl group, a C2 to C20 alkynyl group, a C6 to C30 aryl group, a C7 to C30 arylalkyl group, a C1 to C30 alkoxy group, a C1 to C20 heteroalkyl group, a C3 to C20 heteroaryl group, a C3 to C20 heteroarylalkyl group, a C3 to C30 cycloalkyl group, a C3 to C15 cycloalkenyl group, a C6 to C15 cycloalkynyl group, a C3 to C30 heterocycloalkyl group, or a combination thereof.

As used herein, when specific definition is not otherwise provided, the term "hetero" refers to one including 1 to 4 heteroatoms selected from N, O, S, Se, Te, Si, and P.

Hereinafter, when a definition is not otherwise provided, the energy level corresponds to the highest occupied molecular orbital (HOMO) energy level or the lowest unoccupied molecular orbital (LUMO) energy level.

Hereinafter, when a definition is not otherwise provided, a work function or an energy level is expressed as an absolute value from a vacuum level. In addition, when the work function or the energy level is referred to be deep, high, or large, it may have a large absolute value based on "0 eV" of the vacuum level while when the work function or the energy level is referred to be shallow, low, or small, it may have a small absolute value based on "0 eV" of the vacuum level.

Hereinafter, a photodiode element according to some example embodiments is described with reference to the drawings.

Figures 2A, 2B:
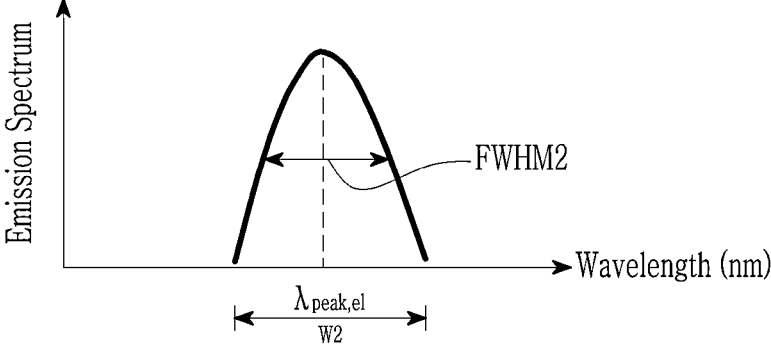
FIGS. 2A and 2B are graphs showing an example of an absorption spectrum of a photoelectric conversion layer and an example of an emission spectrum of a light-emitting layer of the photodiode element of FIG. 1, FIGS. 3 to 6 are schematic views showing examples of energy diagrams of the photodiode element of FIG. 1, respectively.

FIG. 1 is a cross-sectional view showing an example of a photodiode element according to some example embodiments, and FIGS. 2A and 2B are graphs showing an example of an absorption spectrum of a photoelectric conversion layer and an example of an emission spectrum of a light-emitting layer of the photodiode element of FIG. 1.

Referring to FIG. 1, a photodiode element 100 according to some example embodiments includes a first electrode 10, a second electrode 20, a photoelectric conversion layer 30, a light-emitting layer 40, a first charge transport layer 50, a second charge transport layer 60, and a third charge transport layer 70.

The first electrode 10 and the second electrode 20 may face each other, and one of the first electrode 10 and the second electrode 20 may be a light-receiving electrode disposed in a direction to which light is incident.

At least one of the first electrode 10 or the second electrode 20 may be or may include a light-transmitting electrode. The light-transmitting electrode may be or may include a transparent electrode or a semi-transmissive electrode. The transparent electrode may have a transmittance of greater than or equal to about 80%, for example greater than or equal to about 85%, greater than or equal to about 88%, or greater than or equal to about 90%. The semi-transmissive electrode may have a transmittance of, for example, about 10 to about 70%, about 20 to about 60%, or about 30 to about 50%. The transparent electrode and/or semi-transmissive electrode may include, for example, at least one of an oxide conductor, a carbon conductor, and a thin metal film. The oxide conductor may include, for example, at least one of indium tin oxide (ITO), indium zinc oxide (IZO), zinc tin oxide (ZTO), aluminum tin oxide (ATO) and aluminum zinc oxide (AZO), or a combination thereof, the carbon conductor may include graphene, carbon nanostructure, or a combination thereof, and the metal thin film may be an ultrathin film including aluminum (Al), magnesium (Mg), silver (Ag), gold (Au), copper (Cu), magnesium-silver (Mg—Ag), magnesium-aluminum (Mg—Al), an alloy thereof, or a combination thereof.

The semi-transmissive electrode includes a semi-transmissive layer having the aforementioned transmittance and may further include a light-transmitting auxiliary layer on and/or under the semi-transmissive layer. The light-transmitting auxiliary layer may include an optically transparent conductor, for example, indium tin oxide (ITO), indium zinc oxide (IZO), zinc tin oxide (ZTO), aluminum tin oxide (ATO), or aluminum zinc oxide (AZO), or a combination thereof, but is not limited thereto.

Any one of the first electrode 10 or the second electrode 20 may be or may include a reflective electrode. The reflective electrode may have, for example, a light transmittance of less than about 10% or a high reflectance of greater than or equal to about 50%. The reflective electrode may include a reflective conductor such as a metal, for example, aluminum (Al), silver (Ag), gold (Au), or a combination or alloy thereof. The reflective electrode may further include a light-transmitting auxiliary layer on and/or under the reflective layer. The light-transmitting auxiliary layer may be the same as described above.

For example, the first electrode 10 may be a light-receiving electrode, and may be or may include a transparent electrode or a semi-transmissive electrode. The second electrode 20 may be or may include a transparent electrode or a reflective electrode.

For example, each of the first electrode 10 and the second electrode 20 may be or may include a transparent electrode.

For example, the first electrode 10 may be or may include a transparent electrode and the second electrode 20 may be or may include a reflective electrode.

For example, the first electrode 10 may be or may include a semi-transmissive electrode and the second electrode may be or may include a reflective electrode.

One of the first electrode 10 or the second electrode 20 is or corresponds to an anode and the other is or corresponds to a cathode. For example, the first electrode 10 may be an anode and the second electrode 20 may be a cathode. Alternatively, for example, the first electrode 10 may be a cathode and the second electrode 20 may be an anode.

The photoelectric conversion layer 30 may be between the first electrode 10 and the second electrode 20.

The photoelectric conversion layer 30 may be configured to absorb light of a particular, e.g. a predetermined or dynamically determined wavelength spectrum (hereinafter referred to as a "first wavelength spectrum") and convert the absorbed light into an electrical signal. Herein, the first wavelength spectrum may be a wavelength range or band from a start wavelength to an end wavelength of the absorption spectrum of the photoelectric conversion layer 30, and may be defined as W1 in FIG. 2. The first wavelength spectrum W1 may be at least a portion of an ultraviolet to infrared wavelength spectrum, for example, a portion of a wavelength spectrum of about 200 nm to about 3000 nm. For example, the first wavelength spectrum W1 may include a portion of a visible light region to an infrared wavelength spectrum, for example, a portion of a wavelength spectrum of about 380 nm to about 2000 nm. For example, the first wavelength spectrum W1 may belong to a visible light wavelength spectrum and/or an infrared wavelength spectrum, and for example, the first wavelength spectrum W1 may be a blue wavelength spectrum, a green wavelength spectrum, a red wavelength spectrum, an infrared wavelength spectrum, or a combination thereof.

For example, when the first wavelength spectrum W1 is or is within a blue wavelength spectrum, the absorption peak wavelength $\lambda_{peak,A}$ of the absorption spectrum of the photoelectric conversion layer 30 may be greater than or equal to about 380 nm and less than about 500 nm. For example, when the first wavelength spectrum W1 is or is within a green wavelength spectrum, the absorption peak wavelength $\lambda_{peak,A}$ of the absorption spectrum of the photoelectric conversion layer 30 may be to about 500 nm to about 600 nm. For example, when the first wavelength spectrum W1 is or is within a red wavelength spectrum, the absorption peak wavelength $\lambda_{peak,A}$ of the absorption spectrum of the photoelectric conversion layer 30 may be greater than about 600 nm and less than about 700 nm.

The photoelectric conversion layer 30 may include at least one p-type semiconductor (e.g., semiconductor material having majority hole carriers) or at least one n-type semiconductor (e.g. semiconductor material having majority electron carriers) for photoelectric conversion of the absorbed light. The p-type semiconductor and the n-type semiconductor may form a pn junction, and after absorbing light to generate electron-hole pairs, the electron-hole pairs may be separated into electrons and holes.

At least one of the p-type semiconductor or the n-type semiconductor may be a light absorbing material, for example, each of the p-type semiconductor and the n-type semiconductor may be a light absorbing material. The light absorbing material may include, for example, an organic light absorbing material, an inorganic light absorbing material, an organic-inorganic light absorbing material, or a combination thereof. At least one of the p-type semiconductor or the n-type semiconductor may be a wavelength-selective light absorbing material, and the p-type semiconductor and the n-type semiconductor may have an absorption peak wavelength $\lambda_{peak,A}$ in the same or different wavelength spectrum.

For example, at least one of the p-type semiconductor or the n-type semiconductor may be or may include a light absorbing material having an absorption peak wavelength $\lambda_{peak,A}$ in a wavelength spectrum of greater than or equal to about 380 nm and less than about 500 nm, and for example, an organic light absorbing material, an inorganic light absorbing material, an organic-inorganic light absorbing material, or a combination thereof having an absorption peak wavelength $\lambda_{peak,A}$ in a wavelength spectrum of about 410 nm to about 480 nm.

For example, at least one of the p-type semiconductor or the n-type semiconductor may be or may include a light absorbing material having an absorption peak wavelength $\lambda_{peak,A}$ in a wavelength spectrum of about 500 nm to about 600 nm, and for example, an organic light absorbing material, an inorganic light absorbing material, an organic-inorganic light absorbing material, or a combination thereof having an absorption peak wavelength $\lambda_{peak,A}$ in a wavelength spectrum of about 520 nm to about 580 nm.

For example, at least one of the p-type semiconductor or the n-type semiconductor may be or may include a light absorbing material having an absorption peak wavelength $\lambda_{peak,A}$ in a wavelength spectrum of greater than about 600 nm and less than about 700 nm, and for example, an organic light absorbing material, an inorganic light absorbing material, an organic-inorganic light absorbing material, or a combination thereof having an absorption peak wavelength $\lambda_{peak,A}$ in a wavelength spectrum of about 620 nm to about 680 nm.

For example, any one of the p-type semiconductor or the n-type semiconductor may be or may include an organic light absorbing material, for example, a low-molecular light absorbing material having a molecular weight of less than or equal to about 1,000 g/mol or light absorbing polymer. For example, any one of the p-type semiconductor or the n-type semiconductor may be or may include a fullerene or a fullerene derivative.

The photoelectric conversion layer 30 may include an intrinsic layer (I layer) in which a p-type semiconductor and an n-type semiconductor are blended in a bulk heterojunction form. Herein, the p-type semiconductor and the n-type semiconductor may be blended in a volume ratio (or thickness ratio) of about 1:9 to about 9:1, and within the above range, for example, in a volume ratio (or thickness ratio) of about 2:8 to about 8:2, about 3:7 to about 7:3, about 4:6 to about 6:4, or about 5:5.

The photoelectric conversion layer 30 may further include a p-type layer and/or an n-type layer in addition to the I layer. The p-type layer may include the aforementioned p-type semiconductor, and the n-type layer may include the aforementioned n-type semiconductor. For example, it may be included in various combinations such as p-type layer/I layer, I layer/n-type layer, p-type layer/I layer/n-type layer, and the like.

The photoelectric conversion layer 30 may include a bi-layer including a p-type layer including a p-type semiconductor and an n-type layer including an n-type semiconductor. The p-type layer may include the aforementioned p-type semiconductor, and the n-type layer may include the aforementioned n-type semiconductor. Herein, the thickness ratio of the p-type layer and the n-type layer may be about 1:9 to about 9:1, and within the above range, for example, about 2:8 to about 8:2, about 3:7 to about 7:3, about 4:6 to about 6:4, or about 5:5. Doping or impurity concentrations of the p-type layer may be the same as, greater than, or less than doping or impurity concentrations of the n-type layer.

A thickness of the photoelectric conversion layer 30 may be about 5 nm to about 800 nm, and within the above range, about 10 nm to about 700 nm, about 10 to about 500 nm, about 10 nm to about 300 nm, about 100 nm to about 800 nm, about 100 nm to about 700 nm, about 100 nm to about 500 nm or about 100 nm to about 300 nm. By having a thickness within the above ranges, the photoelectric conversion efficiency may be more effectively improved by more effectively absorbing light and effectively separating electrons and holes from the electron-hole pairs.

The light-emitting layer 40 may be between the photoelectric conversion layer 30 and the second electrode 20 and may be spaced apart from the photoelectric conversion layer 30 between the first electrode 10 and the second electrode 20.

The light-emitting layer 40 may be configured to emit light in a predetermined or dynamically determined wavelength spectrum or band (hereinafter referred to as a "second wavelength spectrum"), and is or corresponds to an electroluminescent light-emitting layer configured to emit light by recombination of injected electric charges (electrons and holes). Herein, the second wavelength spectrum may be a wavelength range from a start wavelength to an end wavelength of the emission spectrum of the light-emitting layer 40, and may be defined as W2 in FIG. 2. The second wavelength spectrum W2 may be at least a portion of an ultraviolet to infrared wavelength spectrum, for example, a portion of a wavelength spectrum of about 200 nm to about 3000 nm. For example, the second wavelength spectrum W2 may be a portion of a visible ray to an infrared wavelength spectrum, for example, a portion of a wavelength spectrum of about 380 nm to about 2000 nm. For example, the second wavelength spectrum W2 may belong to or be within a visible light wavelength spectrum and/or an infrared wavelength spectrum, and for example, the second wavelength spectrum W2 may be or be within a blue wavelength spectrum, a green wavelength spectrum, a red wavelength spectrum, an infrared wavelength spectrum, or a combination thereof.

The second wavelength spectrum W2 may be at least partially overlapped with the aforementioned first wavelength spectrum W1. For example, the emission spectrum of the light-emitting layer 40 may be at least partially overlapped with the absorption spectrum of the photoelectric conversion layer 30. For example, the emission peak wavelength $\lambda_{peak,el}$ of the emission spectrum of the light-emitting layer 40 may belong to the wavelength spectrum of the absorption spectrum of the photoelectric conversion layer 30, that is, the first wavelength spectrum W1, and thus the light emitted from the light-emitting layer 40 may be effectively absorbed by the photoelectric conversion layer 30.

For example, when the first wavelength spectrum W1 is or is within a blue wavelength spectrum, the emission peak wavelength $\lambda_{peak,el}$ of the emission spectrum of the light-emitting layer 40 may belong to greater than or equal to about 380 nm and less than about 500 nm. For example, when the first wavelength spectrum W1 is or is within a green wavelength spectrum, the emission peak wavelength $\lambda_{peak,el}$ of the emission spectrum of the light-emitting layer 40 may be in the range of about 500 nm to about 600 nm. For example, when the first wavelength spectrum W1 is or is within a red wavelength spectrum, the emission peak wavelength $\lambda_{peak,el}$ of the emission spectrum of the light-emitting layer 40 may be greater than about 600 nm and less than or equal to 700 nm. For example, when the first wavelength spectrum W1 is or is within an infrared wavelength spectrum, the emission peak wavelength $\lambda_{peak,el}$ of the emission spectrum of the light-emitting layer 40 may be greater than about 700 nm and less than or equal to about 2000 nm.

The emission peak wavelength $\lambda_{peak,el}$ of the emission spectrum of the light-emitting layer 40 may be the same as or different from (e.g. greater than or less than) the absorption peak wavelength $\lambda_{peak,A}$ of the absorption spectrum of the photoelectric conversion layer 30. For example, a difference between the emission peak wavelength $\lambda_{peak,el}$ of the emission spectrum of the light-emitting layer 40 and the absorption peak wavelength $\lambda_{peak,A}$ of the absorption spectrum of the photoelectric conversion layer 30 may be less than or equal to about 100 nm, and within the above range, about 0 nm to about 100 nm, about 0 nm to about 90 nm, about 0 nm to about 80 nm, about 0 nm to about 70 nm, about 0 nm to about 60 nm, about 0 nm to about 50 nm, about 0 nm to about 40 nm, about 0 nm to about 30 nm, about 0 nm to about 20 nm, or about 0 nm to about 10 nm.

As described above, the difference between the emission peak wavelength $\lambda_{peak,el}$ of the emission spectrum of the light-emitting layer 40 and the absorption peak wavelength $\lambda_{peak,A}$ of the absorption spectrum of the photoelectric conversion layer 30 may be relatively small, and accordingly an absorbance of the photoelectric conversion layer 30 at the emission peak wavelength $\lambda_{peak,el}$ of the emission spectrum of the light-emitting layer 40 may be relatively high. For example, an absorbance of the absorption spectrum of the photoelectric conversion layer 30 at the emission peak wavelength $\lambda_{peak,el}$ of the emission spectrum of the light-emitting layer 40 may be about 50% to about 100%, and within the above range about 60% to about 100%, about 70% to about 100%, about 80% to about 100%, or about 90% to about 100% of the maximum absorbance (i.e., absorbance at the absorption peak wavelength).

Various measures of dispersion, such as various absolute or relative measures of dispersion, of the emission spectrum and the absorption spectrum may be used to describe a range of the spectrums. For example, any or all of a range, a variance, a standard deviation, an interquartile range, or a full width at half maximum of the emission spectrum may be less than the corresponding range, variance, standard deviation, interquartile range, and full width at half maximum of the absorption spectrum.

For example, a full width at half maximum (hereinafter referred to as a "FWHM2") of the emission spectrum of the light-emitting layer 40 may be narrower than a full width at half maximum (hereinafter referred to as a "FWHM1") of the absorption spectrum of the photoelectric conversion layer 30. Herein, the FWHM2 of the emission spectrum is or corresponds to a width of a wavelength corresponding to half of the emission peak point, and the FWHM1 of the absorption spectrum is or corresponds to a width of the wavelength corresponding to half of the absorption peak point. For example, the FWHM2 of the emission spectrum of the light-emitting layer 40 may be about 0.10 to about 0.95 relative to the FWHM1 of the absorption spectrum of the photoelectric conversion layer 30, and within the above range, about 0.10 to about 0.90, about 0.20 to about 0.90, about 0.20 to about 0.80, about 0.20 to about 0.70, or about 0.20 to about 0.50. For example, the FWHM2 of the emission spectrum of the light-emitting layer 40 may be about 5 nm to about 150 nm, and the FWHM1 of the absorption spectrum of the photoelectric conversion layer 30 may be about 50 nm to about 500 nm. For example, the FWHM2 of the emission spectrum of the light-emitting layer 40 may be about 5 nm to about 80 nm, and the FWHM1 of the absorption spectrum of the photoelectric conversion layer 30 may be greater than about 80 nm and less than or equal to about 450 nm.

For example, the emission spectrum of the light-emitting layer 40 may fall within or fully within or effectively within the absorption spectrum of the photoelectric conversion layer 30, and thus the second wavelength spectrum W2 may be the same as or narrower than the first wavelength spectrum W1, and for example, the second wavelength spectrum W2 may belong to or be within the first wavelength spectrum W1. Accordingly, the light emitted from the light-emitting layer 40 may be more effectively absorbed by the photoelectric conversion layer 30.

For example, the first wavelength spectrum W1 and the second wavelength spectrum W2 may each belong to or be within a visible light wavelength spectrum. For example, the first wavelength spectrum W1 and the second wavelength spectrum W2 may each belong to a blue wavelength spectrum. For example, the first wavelength spectrum W1 and the second wavelength spectrum W2 may each belong to or be within the green wavelength spectrum. For example, the first wavelength spectrum W1 and the second wavelength spectrum W2 may each belong to or be within a red wavelength spectrum.

For example, the first wavelength spectrum W1 and the second wavelength spectrum W2 may each belong to or be within the infrared wavelength spectrum. For example, the first wavelength spectrum W1 and the second wavelength spectrum W2 may each belong to or be within the near-infrared wavelength spectrum. For example, the first wavelength spectrum W1 and the second wavelength spectrum W2 may each belong to or be within a short-wavelength infrared spectrum. For example, the first wavelength spectrum W1 and the second wavelength spectrum W2 may each belong to or be within a far-infrared spectrum.

The first charge transport layer 50 may be between the photoelectric conversion layer 30 and the light-emitting layer 40.

The first charge transport layer 50 may be a semiconductor layer capable of injecting and transporting electric charges (holes and/or electrons) that are separated from the photoelectric conversion layer 30 into the light-emitting layer 40, and may be or may include a hole transport layer (HTL) capable of selectively injecting and/or transporting holes or an electron transport layer (ETL) capable of selectively injecting and/or transporting electrons.

The first charge transport layer 50 may be configured to transmit the light emitted from the light-emitting layer 40 to the photoelectric conversion layer 30, and thus may be or may correspond to a light-transmitting layer. For example, the first charge transport layer 50 may be configured to transmit about 80% or more, about 85% or more, about 88% or more, about 90% or more, about 92% or more, about 95% or more, about 97% or more, or about 99% or more of the light emitted from the light-emitting layer 40. For example, a bandgap energy of the first charge transport layer 50 may be greater than or equal to about 2.8 eV, and within the above range about 2.8 eV to about 6.0 eV, about 3.0 eV to about 6.0 eV, or about 3.2 eV to about 6.0 eV.

For example, the first charge transport layer 50 may be or may include a hole transport layer (HTL), and a HOMO energy level of the first charge transport layer 50 may be deep or shallow within the range of less than about 1.0 eV than a HOMO energy level of the p-type semiconductor of the photoelectric conversion layer 30. A difference between the HOMO energy level of the first charge transport layer 50 and the HOMO energy level of the p-type semiconductor of the photoelectric conversion layer 30 may be about 0 eV to about 0.8 eV, and within the above range, about 0 eV to about 0.7 eV, about 0 eV to about 0.5 eV, about 0 eV to about 0.3 eV, about 0 eV to about 0.2 eV, or about 0 eV to about 0.1 eV.

The hole transport layer (HTL) may include a p-type organic material, a p-type inorganic material, a p-type organic-inorganic material, or a combination thereof having the aforementioned electrical and optical properties. The hole transport layer (HTL) may include, for example, N,N,N',N'-tetrakis (4-methoxyphenyl)-benzidine (TPD), N,N'-diphenyl-N,N'-bis-[4-(phenyl-m-tolyl-amino)-phenyl]-biphenyl-4,4'-diamine) (DNTPD), N,N'-bis(1-naphthyl)-N,N'-diphenyl-(1,1'-biphenyl)-4,4'-diamine (NPD), 4,4'4"-tris(N,N-diphenylamino)triphenylamine (TDATA), 4,4',4"-tris[phenyl(m-tolyl) amino]triphenylamine (m-MTDATA), 4,4',4"-tris(N-carbazolyl)-triphenylamine (TCTA), 1,1-bis[(di-4-tolylamino)phenyl]cyclohexane (TAPC), N2,N7-di (naphthalen-1-yl)-9,9-dioctyl-N2,N7-diphenyl-9H-fluorene-2,7-diamine (NPB), 2,7-bis(carbazol-9-yl)-9,9-spirobifluorene (Spiro-2CBP), 2,2',7,7'-Tetra(N,N-di-p-tolyl)amino-9,9-spirobifluorene (Spiro-TTB), 2,2',7,7'-Tetrakis(N,N-diphenylamino)-9,9-spirobifluorene (Spiro-TAD), 1,1-bis[(di-4-tolylamino)phenyl]cyclohexane (TAPC), 4,4'-bis(N-carbazolyl)-1,1'-biphenyl (CBP), 4,4',4"-tris[2-naphthyl(phenyl)amino]triphenylamine (2-TNATA), 1,3,5-tris (4-diphenylaminophenyl)benzene (TDAPB), N-phenylcarbazole, polyvinylcarbazole, a fluorene-based derivative, poly(9,9-dioctyl-fluorene-co-N-(4-butylphenyl)-diphenylamine) (TFB), polyarylamine, poly (N-vinylcarbazole) (poly(N-vinylcarbazole), poly(3,4-ethylenedioxythiophene) (PEDOT), poly(3,4-ethylenedioxythiophene) polystyrene sulfonate (PEDOT:PSS), PANI/DBSA (polyaniline/dodecylbenzenesulfonic acid), PANI/CSA (polyaniline/camphor sulfonic acid), PANI/PSS (polyaniline/poly(4-styrenesulfonate)), polyaniline, polypyrrole, Spiro-PMATD, triphenylbismuth dichloride (TPBC), pyridine diimide (PDI), poly(triaryl amine) (PTAA), poly(3-hexylthiophene-2,5-diyl) (P3HT), poly[3-(5-carboxypentyl)thiophene-2,5-diyl] (P3CPenT), poly[2,6-(4,4-bis-(2-ethylhexyl)-4H-cyclopenta[2,1-b;3,4-b']dithiophene)-alt-4,7 (2,1,3-benzothiadiazole)] (PCPDT-t), poly (2,3-dihydrothieno[3,4-b][1,4]dioxane-5,7-diyl) (PEDOT-S), poly ferric sulfate (PFS), a phthalocyanine compound, CuI, $Cu_2O$, CuO, CuS, NiOx, $CuGaO_2$, CuPc, CuSCN, $MoO_x$, $MoS_2$, $VO_x$, $CoO_x$, graphene oxide, or a combination thereof, but example embodiments are not limited thereto.

For example, the first charge transport layer 50 may be or may include an electron transport layer (ETL), and a LUMO energy level of the first charge transport layer 50 may be deep or shallow within the range of less than about 1.0 eV than the LUMO energy level of the n-type semiconductor of the photoelectric conversion layer 30. A difference between the LUMO energy level of the first charge transport layer 50 and the LUMO energy level of the n-type semiconductor of the photoelectric conversion layer 30 may be about 0 eV to about 0.8 eV, and within the above range, about 0 eV to about 0.7 eV, about 0 eV to about 0.5 eV, about 0 eV to about 0.3 eV, about 0 eV to about 0.2 eV, or about 0 eV to about 0.1 eV.

The electron transport layer (ETL) may include an n-type organic material, an n-type inorganic material, an n-type organic-inorganic material, or a combination thereof having the aforementioned electrical and/or optical properties. The electron transport layer may include, for example, a metal halide such as LiF, NaCl, CsF, RbCl, and RbI; a lanthanide metal such as Yb; a metal such as calcium (Ca), potassium (K), aluminum (Al), or an alloy thereof; a metal oxide such as $Li_2O$, BaO, and ZnO; Liq (lithium quinolate), Alq3 (tris(8-hydroxyquinolinato)aluminum), 1,3,5-tri[(3-pyridyl)-phen-3-yl]benzene, 2,4,6-tris(3'-(pyridin-3-yl)biphenyl-3-yl)-1,3,5-triazine, 2-(4-(N-phenylbenzoimidazolyl-1-ylphenyl)-9,10-dinaphthylanthracene, TPBi (1,3,5-tri(1-phenyl-1H-benzo[d]imidazol-2-yl)phenyl), BCP (2,9-

Dimethyl-4,7-diphenyl-1,10-phenanthroline), Bphen (4,7-diphenyl)-1,10-phenanthroline), TAZ (3-(4-biphenylyl)-4-phenyl-5-tertbutylphenyl-1,2,4-triazole), NTAZ (4-(naphthalen-1-yl)-3,5-diphenyl-4H-1,2,4-triazole), t-Bu-PBD (2-(4-biphenylyl)-5-(4-tert-butylphenyl)-1,3,4-oxadiazole), BAlq (bis(2-methyl-8-quinolinolato-N1,O8)-(1,1'-biphenyl-4-olato)aluminum), Bebq2 (beryllium bis(benzoquinolin-10-olate), AND (9,10-di(naphthalene-2-yl)anthracene), BmPyPhB (1,3-Bis[3,5-di(pyridin-3-yl)phenyl]benzene), or a combination thereof, but example embodiments are not limited thereto.

The second charge transport layer 60 may be between the first electrode 10 and the photoelectric conversion layer 30.

The second charge transport layer 60 may be configured to effectively transport one or both of electrons or holes separated from the electron-hole pairs generated in the photoelectric conversion layer 30 to the first electrode 10, and at the same time, may be configured to effectively inject and/or transport one or both of, e.g. the other of, holes or electrons from the first electrode 10 to the photoelectric conversion layer 30. The second charge transport layer 60 may be or may include a hole transport layer (HTL) or an electron transport layer (ETL), and the descriptions of the hole transport layer (HTL) and the electron transport layer (ETL) are the same as described above.

The third charge transport layer 70 may be between the second electrode 20 and the light-emitting layer 40.

The third charge transport layer 70 may be configured to effectively inject and/or transport one or both of holes and electrons from the second electrode 20 to the light-emitting layer 40. The third charge transport layer 70 may be or may include a hole transport layer (HTL) or an electron transport layer (ETL), and the descriptions of the hole transport layer (HTL) and the electron transport layer (ETL) are the same as described above.

The aforementioned photodiode element 100 may be or may be included in a photoelectric conversion element configured to absorb light and convert the absorbed light into an electrical signal. The light-emitting layer 40 included in the photodiode element 100 may be an auxiliary layer for increasing the amount of light provided to the photoelectric conversion layer 30, and ideally, the light emitted from the light-emitting layer 40 may be all absorbed by the photoelectric conversion layer 30 through the first charge transport layer 50. Therefore, the aforementioned photodiode element 100 may not be a light-emitting element configured to extract light emitted from the light-emitting layer 40 to the outside.

The photodiode element 100 may be continuously operated by incident light and a bias between the first electrode 10 and the second electrode 20. For example, electron-hole pairs in the photoelectric conversion layer 30 are generated by incident light to initiate an operation, separation of electric charges (electrons and holes) from the electron-hole pairs and electroluminescence in the light-emitting layer 40 may occur by the bias between the first electrode 10 and the second electrode 20, and thereby the photodiode element 100 may be operated.

As an example, a method of operating the photodiode element 100 includes a first process of absorbing light incident through the first electrode 10 in the photoelectric conversion layer 30 to generate electron-hole pairs; a second process of moving a first electric charges (one of holes or electrons) separated from the electron-hole pairs by the bias between the first electrode 10 and the second electrode 20 toward the first electrode 10 and moving a second electric charges (the other of electrons or holes) separated from the electron-hole pairs toward the light-emitting layer 40 to be combined with the first electric charges (holes or electrons) injected from the second electrode 20 to emit light; and a third process of absorbing light emitted from the light-emitting layer 40 in the photoelectric conversion layer 30 to additionally generate electron-hole pairs.

The second process and the third process may be repeated two or more times, and accordingly, light emission from the light-emitting layer 40 and absorption from the photoelectric conversion layer 30 are repeated, thereby continuously generating a current in the photoelectric conversion layer 30. The current generated through these processes may be larger than the current generated only by the light incident through the first electrode 10 without the second and third processes. Theoretically, when the second and third processes are repeated a large number of times or are infinitely repeated, the photodiode element 100 may generate a large, e.g. an infinite current, but in practice there is a limit to the current generation because electrical and/or optical losses occur in each process, and there may be a loss of ideality.

As such, the photoelectric conversion layer 30 receives additional light provided from the light-emitting layer 40 in addition to the light incident through the first electrode 10 to increase the amount of absorbed light. Accordingly, it may be possible to increase external quantum efficiency (EQE) compared with the photoelectric conversion element that does not include the light-emitting layer 40.

In general, the EQE of the photoelectric conversion element may be evaluated by the number of incident photons relative to the current (or the number of generated electric charges in units of electrons or holes). In the case of the photoelectric conversion element without the light-emitting layer 40, since the photoelectric conversion element cannot generate more current than the incident photons, theoretically, the EQE cannot exceed about 100%.

In contrast, the photoelectric conversion layer 30 of the aforementioned photodiode element 100 is configured to absorb additional light provided from the light-emitting layer 40 in addition to the light incident through the first electrode 10, thereby electric charges (electrons or holes) generated in the photoelectric conversion layer 30 may be greater than the number of incident photons (from the outside), and thus the EQE may be greater than about 100%. For example, the EQE of the photodiode element 100 may be increased in proportion to the number of repetitions of light emission in the light-emitting layer 40 (second process) and absorption of the light emitted from the light-emitting layer 40 in the photoelectric conversion layer 30 (third process).

Alternatively or additionally, the EQE of a conventional photoelectric conversion element is not affected by the bias between the anode and the cathode, whereas the EQE of the photodiode element 100 described above may be adjusted according to the amount of light emitted in the light-emitting layer 40. Therefore, as the bias between the first electrode 10 and the second electrode 20 is greater, the amount of light emitted from the light-emitting layer 40 may be larger, so that the EQE of the photodiode element 100 may be increased. For example, the EQE of the photodiode element 100 may increase in proportion to the bias between the first electrode 10 and the second electrode 20.

For example, the maximum external quantum efficiency ($EQE_{max}$) of the photodiode element 100 may be greater than or equal to about 90%, greater than or equal to about 100%, greater than or equal to about 110%, greater than or equal to about 120%, greater than or equal to about 130%, or greater than or equal to about 150%, and within the range about 90% to about 2000%, about 100% to about 2000%, about 110% to about 2000%, about 120% to about 2000%, about 130% to about 2000%, or about 150% to about 2000%, but is not limited thereto.

Various examples of the above-described photodiode element 100 will be described with reference to energy diagrams.

FIGS. 3 to 6 are schematic views showing examples of energy diagrams of the photodiode element of FIG. 1, respectively.

Figure 3:
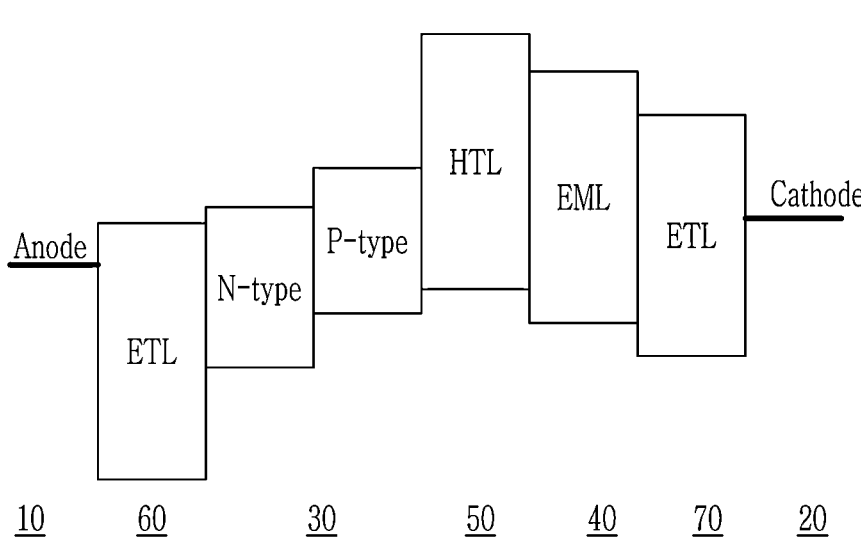
Figure 4:
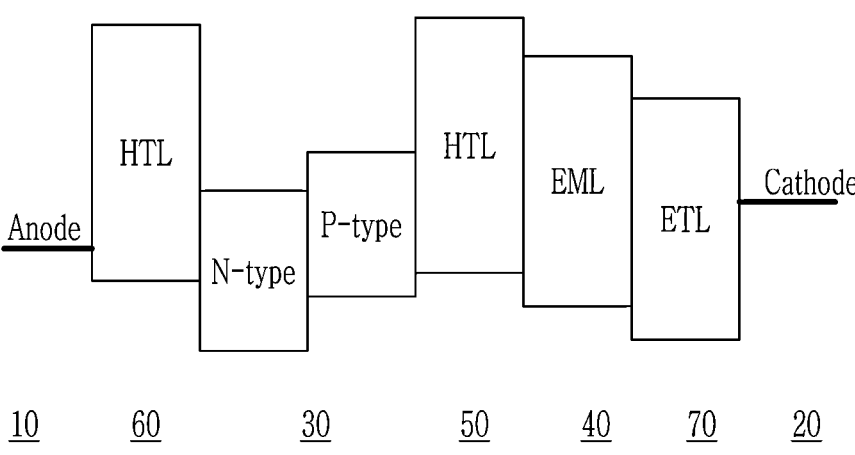

FIGS. 3 and 4 illustrate the structure (e.g., Fermi band diagrams) of the photodiode element 100 in which the first electrode 10 is an anode and the second electrode 20 is a cathode.

For example, referring to FIG. 3, the first electrode 10 may be an anode and a light-receiving electrode, the p-type semiconductor and/or n-type semiconductor of the photo-electric conversion layer 30 may be configured to absorb incident light through the first electrode 10 to generate electron-hole pairs, and electrons and holes may be sepa-rated from the electron-hole pairs by a bias between the first electrode 10 and the second electrode 20. The separated electrons may be transported toward the first electrode 10 through the second charge transport layer 60. The second charge transport layer 60 may be or may include an electron transport layer (ETL) that transports electrons from the photoelectric conversion layer 30 toward the first electrode 10. Meanwhile, the separated holes may pass through the first charge transport layer 50 and may be injected and/or transported to the light-emitting layer 40 and in this case, the first charge transport layer 50 may be or may include a hole transport layer (HTL) that transports holes from the photo-electric conversion layer 30 toward the light-emitting layer 40. Holes reaching the light-emitting layer 40 may be injected from the second electrode 20 and be recombined with electrons passing through the third charge transport layer 70 to emit light. In this case, the third charge transport layer 70 may be or may include an electron transport layer (ETL) that transports electrons from the second electrode 20 toward the light-emitting layer 40.

As described above, the emission spectrum of the light-emitting layer 40 and the absorption spectrum of the pho-toelectric conversion layer 30 may be at least partially overlapped with each other. For example, the emission spectrum of the light-emitting layer 40 may be wholly or at least partially included in the absorption spectrum of the photoelectric conversion layer 30, and thus the light emitted in the light-emitting layer 40 may be substantially all absorbed by the photoelectric conversion layer 30, and the photoelectric conversion layer 30 may generate additional electron-hole pairs from the absorbed light. The additional electron-hole pairs may be separated into electrons and holes by a bias between the first electrode 10 and the second electrode 20, the separated electrons and holes pass through the second charge transport layer 60 and the first charge transport layer 50, respectively, as described above, and are transported to the first electrode 10 and the light-emitting layer 40, and thus the above-described processes may be repeated. Theoretically, when the above processes are infi-nitely repeated, the photodiode element 100 may generate an infinite current, but in practice there is a limit to the current generation because electrical and/or optical losses occur in each process, e.g. because of a lack of ideality. However, the amount of current generated in this way may be large compared with a general photoelectric conversion element that does not include the light-emitting layer 40, and accord-ingly, the EQE of the photodiode element 100 may be greater than about 100%.

For example, referring to FIG. 4, the first electrode 10 may be an anode and a light-receiving electrode, the p-type semiconductor and/or n-type semiconductor of the photo-electric conversion layer 30 may be configured to absorb incident light through the first electrode 10 to generate electron-hole pairs, and electrons and holes may be sepa-rated from the electron-hole pairs by a bias between the first electrode 10 and the second electrode 20. The separated electrons may be recombined with holes injected from the first electrode 10. In this case, the second charge transport layer 60 may be or may include a hole transport layer (HTL) capable of injecting and/or transporting holes from the first electrode 10, and a recombination position of electrons and holes may be, for example, at an interface of the second charge transport layer 60 and the photoelectric conversion layer 30. Meanwhile, the separated holes may pass through the first charge transport layer 50 and may be injected and/or transported to the light-emitting layer 40 and in this case, the first charge transport layer 50 may be or may include a hole transport layer (HTL) that transports holes from the photo-electric conversion layer 30 toward the light-emitting layer 40. Holes that have reached the light-emitting layer 40 may be injected from the second electrode 20 and be recombined with electrons that have passed through the third charge transport layer 70 to emit light. In this case, the third charge transport layer 70 may be or may include an electron transport layer (ETL) that transports electrons from the second electrode 20 toward the light-emitting layer 40.

As described above, the emission spectrum of the light-emitting layer 40 and the absorption spectrum of the pho-toelectric conversion layer 30 may be at least partially overlapped with each other. For example, the emission spectrum of the light-emitting layer 40 may be wholly or partially included in the absorption spectrum of the photo-electric conversion layer 30, and thus the light emitted in the light-emitting layer 40 may be substantially all absorbed by the photoelectric conversion layer 30, and the photoelectric conversion layer 30 may generate additional electron-hole pairs from the absorbed light. The additional electron-hole pairs may be separated into electrons and holes by a bias between the first electrode 10 and the second electrode 20, and the aforementioned processes may be repeated. Since the photodiode element 100 may generate more current than the number of photons incident through the first electrode 10, it may be possible to implement an EQE of greater than about 100%, and the EQE of the photodiode element 100 may be increased in proportion to the number of repetitions of the aforementioned processes.

Figure 5:
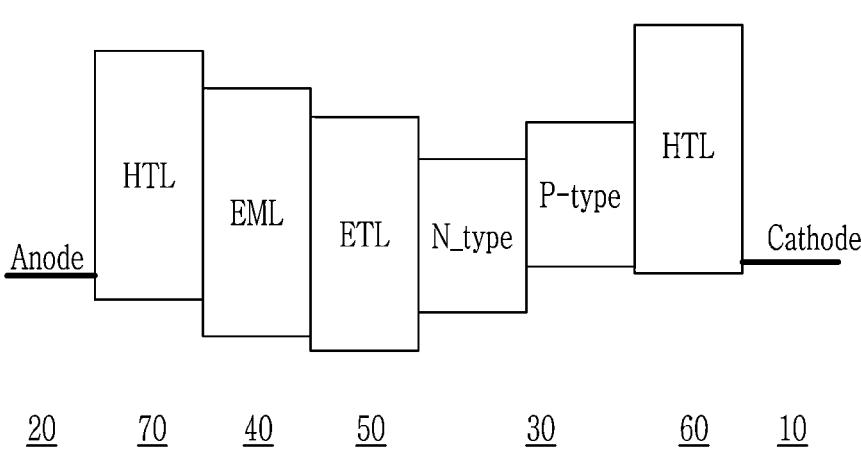
Figure 6:
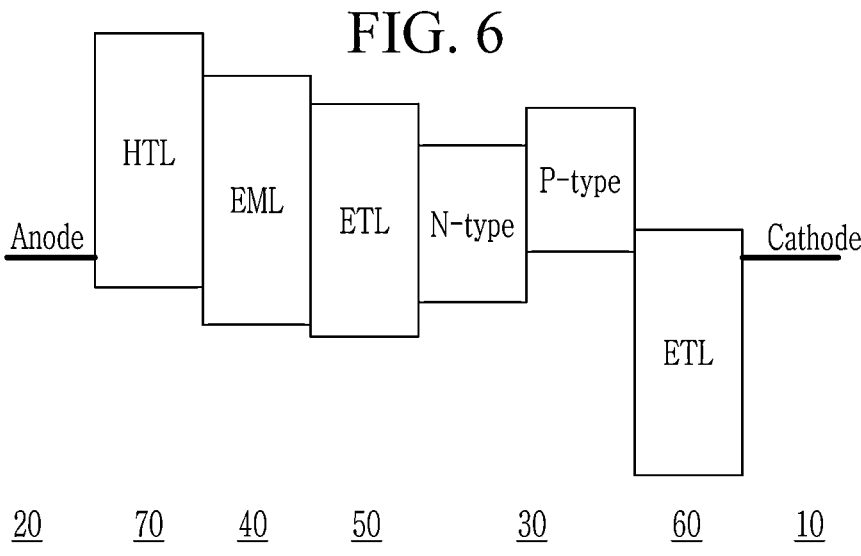

FIGS. 5 and 6 illustrate the structure of, e.g. Fermi band diagrams of the photodiode element 100 in which the first electrode 10 is a cathode and the second electrode 20 is an anode.

For example, referring to FIG. 5, the first electrode 10 may be or correspond to a cathode and a light-receiving electrode, the p-type semiconductor and/or n-type semicon-ductor of the photoelectric conversion layer 30 may be configured to absorb incident light through the first electrode 10 to generate electron-hole pairs, and electrons and holes may be separated from the electron-hole pairs by a bias between the first electrode 10 and the second electrode 20. The separated holes may be transported to the first electrode 10 through the second charge transport layer 60, and in this case, the second charge transport layer 60 may be or may include a hole transport layer (HTL) that transports holes from the photoelectric conversion layer 30 toward the first electrode 10. Meanwhile, the separated electrons may pass through the first charge transport layer 50 and be injected and/or transported to the light-emitting layer 40, and in this case, the first charge transport layer 50 may be or may include an electron transport layer (ETL) that transports electrons from the photoelectric conversion layer 30 toward the light-emitting layer 40. Electrons that have reached the light-emitting layer 40 may be injected from the second electrode 20 and be recombined with holes that have passed through the third charge transport layer 70 to emit light. In this case, the third charge transport layer 70 may be or may include an electron transport layer (HTL) that transports holes from the second electrode 20 toward the light-emitting layer 40.

As described above, the emission spectrum of the light-emitting layer 40 and the absorption spectrum of the photoelectric conversion layer 30 may be at least partially overlapped with each other. For example, the emission spectrum of the light-emitting layer 40 may be included in the absorption spectrum of the photoelectric conversion layer 30, and thus the light emitted in the light-emitting layer 40 may be substantially all absorbed by the photoelectric conversion layer 30, and the photoelectric conversion layer 30 may generate additional electron-hole pairs from the absorbed light. The additional electron-hole pairs may be separated into electrons and holes by a bias between the first electrode 10 and the second electrode 20, and the aforementioned processes may be repeated. Since the photodiode element 100 may generate more current than the number of photons incident through the first electrode 10, it may be possible to implement an EQE of greater than about 100%, and the EQE of the photodiode element 100 may be increased in proportion to the number of repetitions of the aforementioned processes.

For example, referring to FIG. 6, the first electrode 10 may be or may correspond to a cathode and a light-receiving electrode, the p-type semiconductor and/or n-type semiconductor of the photoelectric conversion layer 30 may be configured to absorb incident light through the first electrode 10 to generate electron-hole pairs, and electrons and holes may be separated from the electron-hole pairs by a bias between the first electrode 10 and the second electrode 20. The separated holes may be recombined with electrons injected from the first electrode 10. In this case, the second charge transport layer 60 may be or may include an electron transport layer (ETL) capable of injecting and/or transporting electrons from the first electrode 10 and a recombination position of holes and electrons may be, for example, an interface of the second charge transport layer 60 and the photoelectric conversion layer 30. Meanwhile, the separated electrons may pass through the first charge transport layer 50 and may be injected and/or transported to the light-emitting layer 40 and in this case, the first charge transport layer 50 may be an electron transport layer (ETL) that transports electrons from the photoelectric conversion layer 30 toward the light-emitting layer 40. Electrons that have reached the light-emitting layer 40 may be injected from the second electrode 20 and be recombined with holes that have passed through the third charge transport layer 70 to emit light. In this case, the third charge transport layer 70 may be a hole transport layer (HTL) that transports holes from the second electrode 20 to the light-emitting layer 40.

As described above, the emission spectrum of the light-emitting layer 40 and the absorption spectrum of the photoelectric conversion layer 30 may be at least partially overlapped with each other. For example, the emission spectrum of the light-emitting layer 40 may be wholly or partially included in the absorption spectrum of the photoelectric conversion layer 30, and thus the light emitted in the light-emitting layer 40 may be substantially all absorbed by the photoelectric conversion layer 30, and the photoelectric conversion layer 30 may generate additional electron-hole pairs from the absorbed light. The additional electron-hole pairs may be separated into electrons and holes by a bias between the first electrode 10 and the second electrode 20, and the aforementioned processes may be repeated. Since the photodiode element 100 may generate more current than the number of photons incident through the first electrode 10, it may be possible to implement an EQE of greater than about 100%, and the EQE of the photodiode element 100 may be increased in proportion to the number of repetitions of the aforementioned processes.

As such, the photodiode element 100 may increase the amount of current by additionally absorbing light emitted from the light-emitting layer 40 in addition to the incident light to increase the overall amount of light, thereby realizing high EQE of greater than about 100%.

At this time, as described above, the emission spectrum of the light emitted from the light-emitting layer 40 may be at least partially overlapped with the absorption spectrum of the photoelectric conversion layer 30. For example, since the emission spectrum of the light emitted from the light-emitting layer 40 is included in the absorption spectrum of the photoelectric conversion layer 30, all of the light emitted from the light-emitting layer 40 may be absorbed by the photoelectric conversion layer 30 and not emitted to the outside. Therefore, the photodiode element 100 may be or may be included in a photoelectric conversion element generating a current, but may not be a light-emitting element.

For example, the second electrode 20 may be a reflective electrode, and accordingly, the light emitted from the light-emitting layer 40 may be reflected by the second electrode 20 to be more effectively absorbed by the photoelectric conversion layer 30.

For example, the first electrode 10 may be a semi-transmissive electrode and the second electrode 20 may be a reflective electrode. Accordingly, the first electrode 10 and the second electrode 20 form a microcavity structure. Therefore, a majority or most of the light emitted from the light-emitting layer 40 is primarily absorbed by the photoelectric conversion layer 30, and the light that has not been absorbed is repeatedly reflected between the first electrode 10 and the second electrode 20 by microcavity and is secondarily absorbed by the photoelectric conversion layer 30. As a result, all the light emitted from the light-emitting layer 40 may be absorbed by the photoelectric conversion layer 30, so that the EQE may be further increased without loss of light.

The aforementioned photodiode element 100 may be applied to various fields requiring photoelectric conversion.

The photodiode element 100 may be applied to a sensor requiring high detectivity, and the sensor may be or may include an optical sensor, an image sensor, an infrared sensor, an ultraviolet sensor, or a combination thereof, but is not limited thereto.

As an example, the photodiode element 100 may be applied to an optical sensor. The optical sensor may include, for example, a biosensor. The biosensor may include, for example, a biosignal sensor configured to detect a biosignal temporarily and/or in real time. The biosignal may be, for example, one or more of a blood flow rate, a change in oxygen distribution, and an electrocardiogram obtained from an in vivo target such as a blood vessel, but is not limited thereto.

The biosensor includes a light-emitting element for irradiating light to a living body and a photodiode element for detecting a biosignal from light reflected from an in-vivo target such as a blood vessel.

Figures 7, 8:
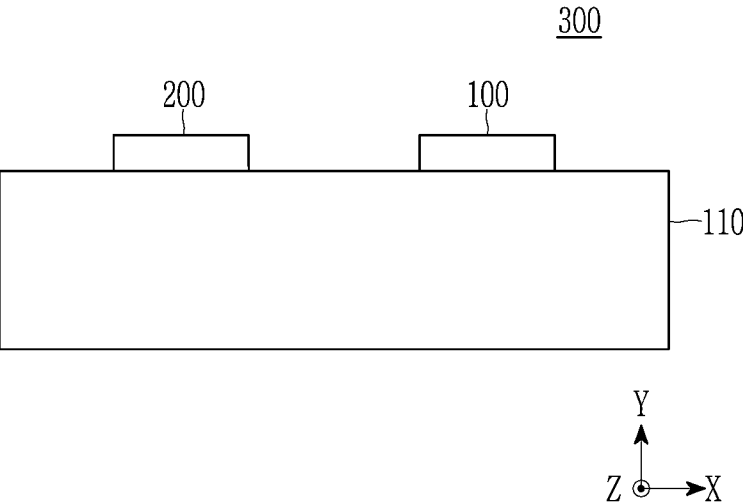
FIG. 7 is a plan view showing an example of a biosensor according to some example embodiments.
FIG. 8 is a cross-sectional view taken along the line VIII-VIII of an example of the biosensor of FIG. 7, FIGS. 9A to 9C are graphs showing the emission spectrum of the light-emitting element, the absorption spectrum of the photoelectric conversion layer of the photodiode element, and the emission spectrum of the light-emitting layer of the photodiode element in the biosensor of FIGS. 7 and 8.
Figure 9A:
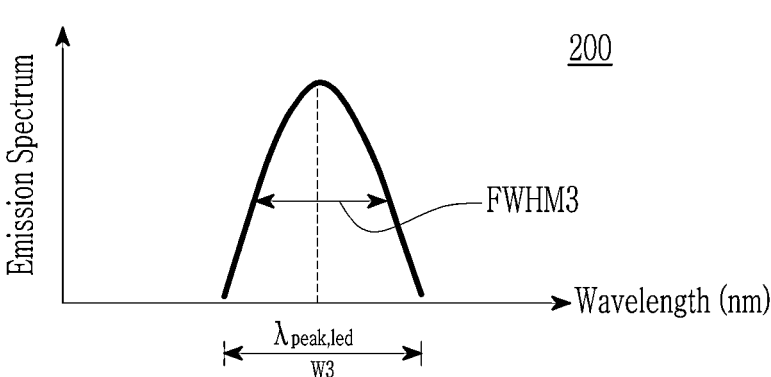
Figure 9B:
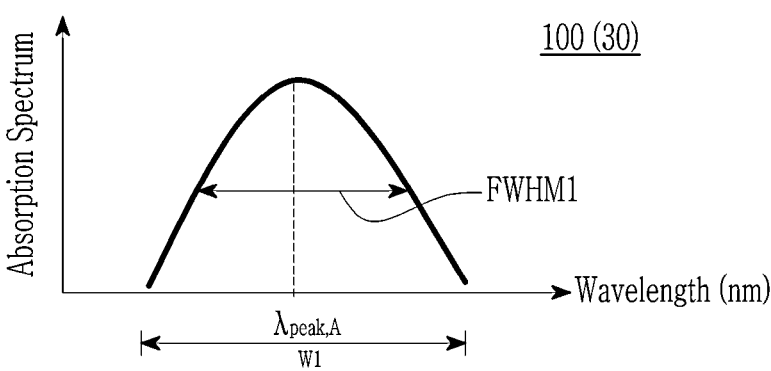
Figure 9C:
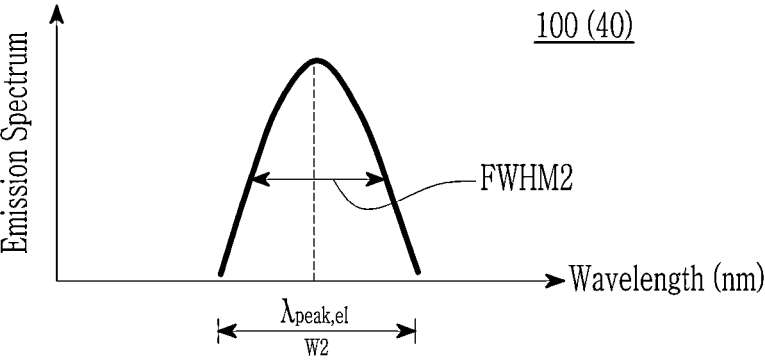

FIG. 7 is a plan view showing an example of a sensor such as a biosensor according to some example embodiments, FIG. 8 is a cross-sectional view taken along the line VIII-VIII of an example of the biosensor of FIG. 7, and FIGS. 9A to 9C are graphs showing the emission spectrum of the light-emitting element, the absorption spectrum of the photoelectric conversion layer of the photodiode element, and the emission spectrum of the light-emitting layer of the photodiode element in the biosensor of FIGS. 7 and 8.

Referring to FIGS. 7 and 8, the biosensor 300 according to some example embodiments includes a light-transmitting layer 110, a light-emitting element 200, and a photodiode element 100.

The light-transmitting layer 110 may be under the light-emitting element 200 and the photodiode element 100 to support the light-emitting element 200 and the photodiode element 100. The light-transmitting layer 110 may be or may include, for example, a support substrate or may be formed on a separate support substrate (not shown). When a separate support substrate is included, the support substrate may be a stretchable or flexible substrate.

The light-transmitting layer 110 may be configured to transmit light, for example, about 70% or more, about 75% or more, about 80% or more, about 85% or more, about 90% or more, about 95% or more, about 97% or more, about 98% or more, or about 99% or more. The light-transmitting layer 110 may arranged be in a direction in which light is emitted from the light-emitting element 200 and in a direction in which light is introduced into the photodiode element 100. For example, the light-transmitting layer 110 may be closer to the skin and a living body (e.g., blood vessel) to be sensed than the light-emitting element 200 and the light.

The light-transmitting layer 110 may be a stretchable and/or flexible light-transmitting layer, and the stretchable and/or flexible light-transmitting layer may flexibly respond to external forces and/or external movements such as one or more of twisting, pressing, and pulling, and may be restored or easily restored to its original state, e.g. may have a plastic property. The light-transmitting layer 110 may include a stretchable material such as an elastomer, and the stretchable material may include an organic elastomer, an organic-inorganic elastomer, an inorganic elastomer-like material, or a combination thereof. The organic elastomer or organic-inorganic elastomer may include, for example, a substituted or unsubstituted polyorganosiloxane such as polydimethylsiloxane, or a substituted or unsubstituted butadiene such as styrene-ethylene-butylene-styrene, an elastomer including a moiety, an elastomer including a urethane moiety, an elastomer including an acrylic moiety, an elastomer including an olefin moiety, or a combination thereof, but example embodiments are not limited to. The inorganic elastomer-like material may include, but is not limited to, a ceramic having elasticity, a solid metal, a liquid metal, or a combination thereof.

The light-transmitting layer 110 may include regions having different stiffness, for example, a first region 110a having a relatively high stiffness and a second region 110b having a relatively lower stiffness than the first region 110a. Herein, the stiffness indicates a degree of resistance against deformation, when an external force is given from outside, and when the stiffness is relatively high, the resistance against deformation is relatively large, and thus the deformation is small, but when the stiffness is relatively low, the resistance against deformation is relatively small, and thus the deformation is large.

The stiffness may be evaluated by using an elastic modulus, wherein a relatively high elastic modulus may correspond to high stiffness, while a relatively low elastic modulus may mean low stiffness. The elastic modulus may be or may be based on, for example, a Young's modulus. A difference between the elastic modulus of the first region 110a and the second region 110b of the light-transmitting layer 110 may be about 100 times or more, and the elastic modulus of the first region 110a may be about 100 times higher than that of the second region 110b. The difference between the elastic modulus of the first region 110a and the second region 110b may be about 100 times to about 100,000 times, within the above range, and the elastic modulus of the first region 110a may be about 100 times to about 100,000 times higher than the elastic modulus of the second region 110b, but is not limited thereto. For example, the elastic modulus of the first region 110a may be about $10^7$ Pa to about $10^{12}$ Pa, and the elastic modulus of the second region 110b may be greater than or equal to about $10^2$ Pa and less than $10^7$ Pa, but example embodiments are not limited thereto.

The elongation rate of the first region 110a and the second region 110b of the light-transmitting layer 110 may be different due to the difference in stiffness described above, and the elongation rate of the second region 110b may be greater than the elongation rate of the first region 110a. Here, the elongation rate may be a percentage of the length change increased to the breaking point with respect to the initial length. For example, the elongation rate of the first region 110a of the stretchable light-transmitting layer 110 may be less than or equal to about 5%, and within the above range, about 0% to about 5%, about 0% to about 4%, about 0% to about 3%, about 0% to about 2%, about 0% to about 1%, about 0.5% to about 5%, about 0.5% to about 4%, about 0.5% to about 3%, about 0.5% to about 2%, or about 1% to about 2%. For example, the elongation rate of the second region 110b of the light-transmitting layer 110 may be greater than or equal to about 10%, and within the above range, about 10% to about 300%, about 10% to about 200%, about 10% to about 100%, about 10% to about 90%, about 10% to about 80%, about 10% to about 70%, about 10% to about 60%, about 10% to about 50%, about 10% to about 40%, about 20% to about 70%, about 20% to about 60%, about 20% to about 50%, or about 20% to about 40%.

The first regions 110a adjacent to the light-transmitting layer 110 may have an island shape that is separate from each other, and a light-emitting element 200 and a photodiode element 100 to be described later are on each first region 110a of the light-transmitting layer 110.

The second region 110b of the light-transmitting layer 110 may be a region other than the first region 110a, and may be continuously or contiguously connected. The second region 110b of the light-transmitting layer 110 may be a region providing stretchability, and may flexibly respond to external forces or external movements such as twisting, pressing, and pulling due to relatively low stiffness and high elongation rate, and may be easily restored to its original state.

For example, the first region 110a and the second region 110b of the light-transmitting layer 110 may include different materials. For example, the first region 110a of the light-transmitting layer 110 may include an inorganic material, an organic material, and/or an organic-inorganic material having relatively high stiffness and low elongation rate, and the second region 110b of the light-transmitting layer 110 may include an inorganic material, an organic material, and/or an organic-inorganic material having relatively low stiffness and high elongation rate. For example, the first region 110a of the light-transmitting layer 110 may include an organic material such as polycarbonate, polymethyl methacrylate, polyethylene terephthalate, polyethylene naphthalate, polyimide, polyamide, polyamideimide, polyethersulfone, or a combination thereof, or a carbon material such as diamond carbon. The second region 110b of the light-transmitting layer 110 may include an organic or organic-inorganic elastomer of substituted or unsubstituted polyorganosiloxane such as polydimethylsiloxane, an elastomer including a substituted or unsubstituted butadiene moiety such as styrene-ethylene-butylene-styrene, an elastomer including a substituted or unsubstituted butadiene moiety, elastomers including an urethane moieties, elastomers including acrylic moiety, elastomers including an olefin moiety, or a combination thereof; inorganic elastomeric materials such as ceramic, a solid metal, a liquid metal, or a combination thereof but not limited thereto.

The photodiode 100 and the light-emitting device 200 are on the light-transmitting layer 110. The photodiode element 100 and the light-emitting element 200 may be arranged in parallel with a predetermined interval therebetween.

The photodiode element 100 is as described above, and the specific structure and description are the same as described above. When the first electrode 10 of the photodiode element 100 is a light-receiving electrode, the first electrode 10 may be close to the light-transmitting layer 110.

The light-emitting element 200 may be configured to emit light in a predetermined wavelength spectrum (hereinafter referred to as a "third wavelength spectrum"). The light emitted from the light-emitting element 200 passes through the light-transmitting layer 110 and is scattered and/or reflected in a target portion (hereinafter referred to as a "target") of a living body such as a blood vessel, and the scattered and/or reflected light passes through the light-transmitting layer 110 again and then is absorbed by the photodiode element 100 to obtain a signal such as a biosignal.

The light-emitting element 200 may include, for example, an inorganic light emitting diode, an organic light emitting diode, an organic-inorganic light emitting diode, or a micro light emitting diode. The light-emitting element 200 may include, for example, a pair of electrodes and a light-emitting layer between the pair of electrodes. For example, one of the pair of electrodes may be a light-transmitting electrode and the other may be a reflective electrode. For example, an electrode close to the light-transmitting layer 110 may be a light-transmitting electrode. As an example, the light-emitting layer may include, but is not limited to, an organic light-emitting material, a light-emitter such as quantum dots and/or perovskite.

The light-emitting layer of the light-emitting element 200 may be configured to emit light in a third wavelength spectrum. The third wavelength spectrum may be a wavelength range from a start wavelength to an end wavelength of the emission spectrum of the light-emitting element 200 and may be defined as W3 in of FIG. 9A. The third wavelength spectrum W3 may be at least partially overlapped with the first wavelength spectrum W1, which is a wavelength range of the absorption spectrum of the photodiode element 100. That is, the emission spectrum of the light-emitting element 200 may be at least partially overlapped with the absorption spectrum of the photoelectric conversion layer 30 of the photodiode element 100. For example, the emission peak wavelength $\lambda_{peak,led}$ of the emission spectrum of the light-emitting element 200 may belong to the wavelength spectrum of the absorption spectrum of the photoelectric conversion layer 30 of the photodiode element 100, for example, the first wavelength spectrum W1. In addition, for example, the full width at half maximum (hereinafter referred to as a "FWHM3") of the emission spectrum of the light-emitting element 200 may be narrower than the FWHM1 of the absorption spectrum of the photoelectric conversion layer 30 of the photodiode element 100. For example, the FWHM3 of the emission spectrum of the light-emitting element 200 may be about 0.10 to about 0.95 relative to the FWHM1 of the photoelectric conversion layer 30 of the photodiode element 100, and within the above range, about 0.20 to about 0.90, about 0.20 to about 0.80, about 0.20 to about 0.70, or about 0.20 to about 0.50. For example, the FWHM3 of the emission spectrum of the light-emitting element 200 may be about 5 nm to about 150 nm, and the FWHM1 of the absorption spectrum of the photoelectric conversion layer 30 of the photodiode element 100 may be about 50 nm to about 300 nm. For example, the FWHM2 of the emission spectrum of the light-emitting element 200 may be about 5 nm to about 80 nm, and the FWHM1 of the absorption spectrum of the photoelectric conversion layer 30 of the photodiode element 100 may be greater than about 80 nm and less than or equal to about 150 nm.

The third wavelength spectrum W3 may be at least partially overlapped with the second wavelength spectrum W2, which is a wavelength range of the emission spectrum of the light-emitting layer 40 of the photodiode element 100, but is not limited thereto. For example, the emission peak wavelength $\lambda_{peak,led}$ of the emission spectrum of the light-emitting element 200 may be the same as or different from (e.g. greater than or less than) the emission peak wavelength $\lambda_{peak,el}$ of the emission spectrum of the emission layer 40 of the photodiode element 100 and the emission peak wavelength $\lambda_{peak,led}$ of the emission spectrum of the light-emitting element 200 and the emission peak wavelength $\lambda_{peak,el}$ of the emission spectrum of the light-emitting layer 40 may belong to the first wavelength spectrum W1 of the photoelectric conversion layer 30 of the photodiode element 100, respectively. Accordingly, the light emitted from the light-emitting element 200 and reflected by the living body may be more effectively absorbed and sensed by the photoelectric conversion layer 30 of the photodiode element 100, and light emitted from the light-emitting layer 40 of the photodiode element 100 may also be effectively absorbed by the photoelectric conversion layer 30 of the photodiode element 100, and as described above, the EQE of the photodiode element 100 may be increased.

Figure 10:
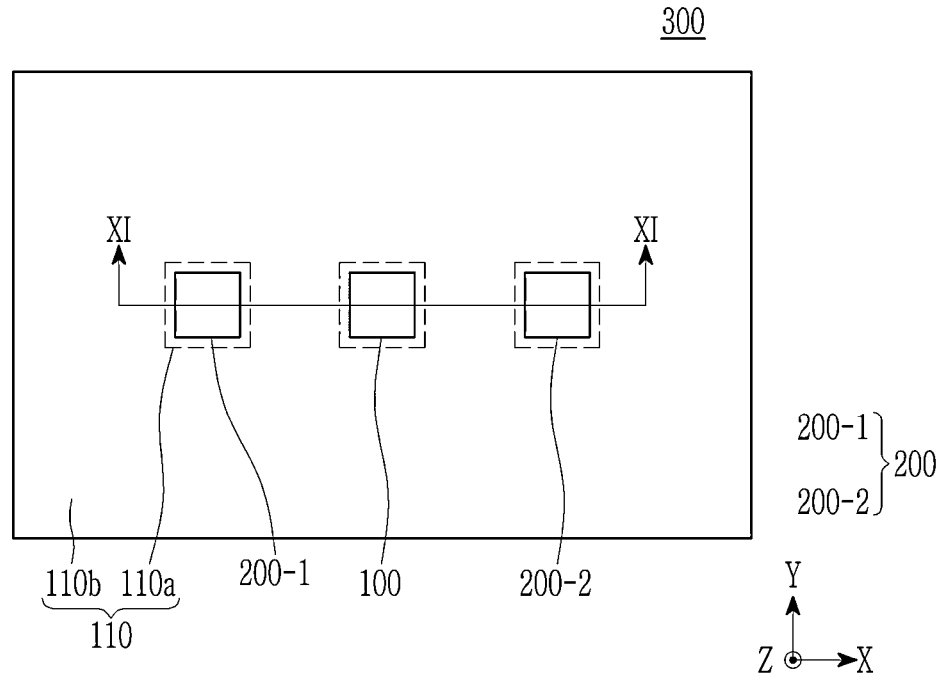
FIG. 10 is a plan view showing another example of a biosensor according to some example embodiments.
Figure 11:
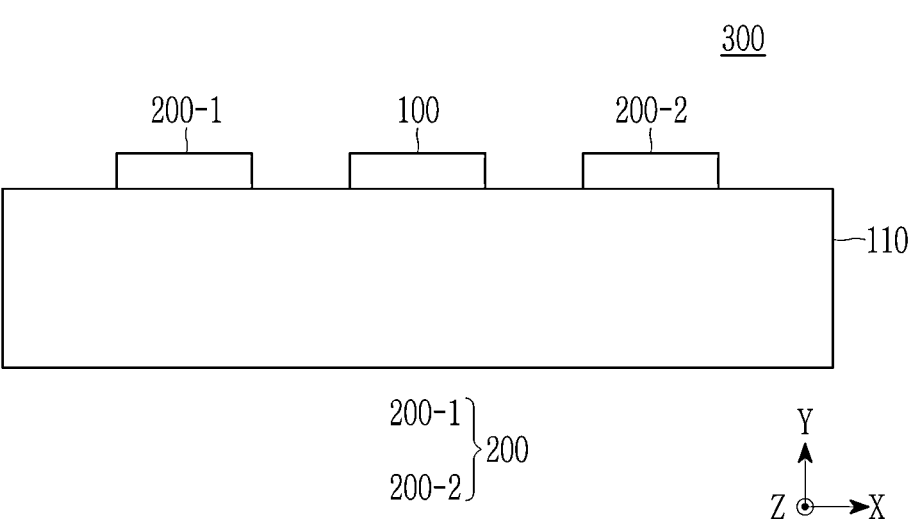
FIG. 11 is a cross-sectional view taken along line XI-XI of an example of the biosensor of FIG. 10, FIGS. 12A to 12C are graphs showing the emission spectrum of the light-emitting element, the absorption spectrum of the photoelectric conversion layer of the photodiode element, and the emission spectrum of the light-emitting layer of the photodiode element in the biosensor of FIGS. 10 and 11.

FIG. 10 is a plan view showing another example of a biosensor according to some example embodiments, FIG. 11 is a cross-sectional view taken along line XI-XI of an example of the biosensor of FIG. 10, and FIGS. 12A to 12C are graphs showing the emission spectrum of the light-emitting element, the absorption spectrum of the photoelectric conversion layer of the photodiode element, and the emission spectrum of the light-emitting layer of the photodiode element in the biosensor of FIGS. 10 and 11.

Referring to FIGS. 10 and 11, the biosensor 300 according to the present embodiment may include the light-transmitting layer 110, the photodiode element 100, and the light-emitting element 200 as in the above-described example.

Figure 12A:
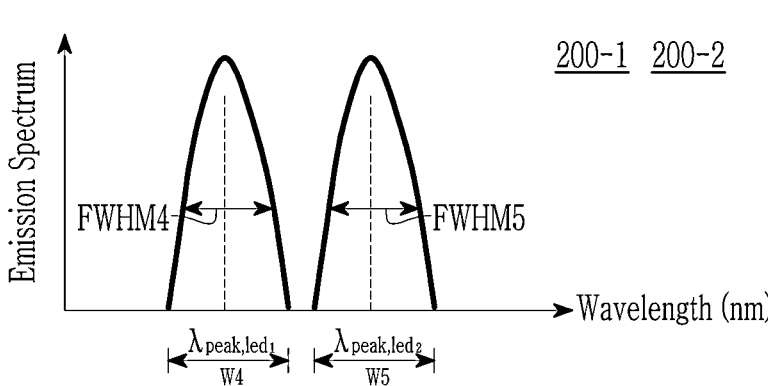
Figure 12B:
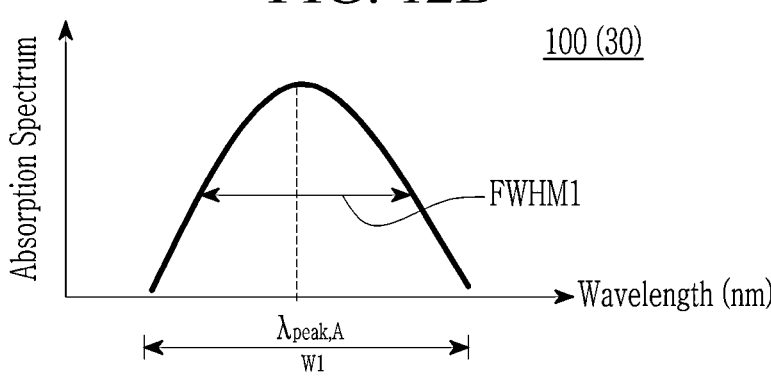
Figure 12C:
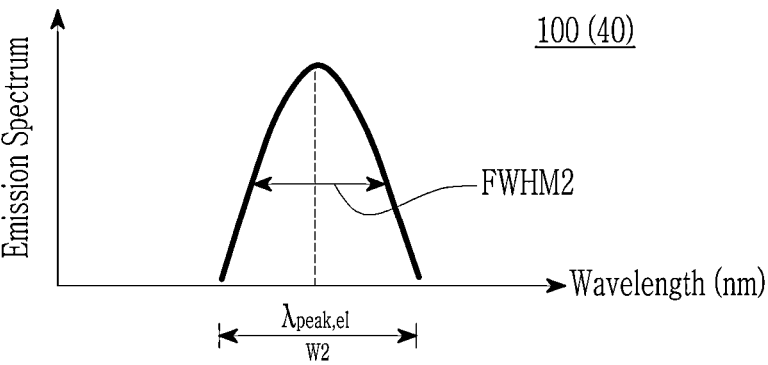

However, the biosensor 300 according to some example embodiment includes a plurality of light-emitting elements 200, unlike the above-described example. The light-emitting element 200 includes a first light-emitting element 200-1 and a second light-emitting element 200-2 configured to emit light of different wavelength spectra. The first light-emitting element 200-1 and the second light-emitting element 200-2 may be used to detect an object having different absorption and/or reflection characteristics. For example, the first light-emitting element 200-1 may be configured to emit light in the fourth wavelength spectrum and the second light-emitting element 200-2 may be configured to emit light in the fifth wavelength spectrum. In FIGS. 12A to 12C, the fourth wavelength spectrum is defined as W4 and the fifth wavelength spectrum is defined as W5.

The fourth wavelength spectrum W4 and the fifth wavelength spectrum W5 may be at least partially overlapped with the first wavelength spectrum W1, which is a wavelength range of the absorption spectrum of the photodiode element 100, respectively. For example, each of the emission spectra of the first and second light-emitting elements 200-1 and 200-2 may be at least partially overlapped with the absorption spectrum of the photoelectric conversion layer 30 of the photodiode element 100. For example, the emission peak wavelengths $\lambda_{peak,led1}$ and $\lambda_{peak,led2}$ of the emission spectra of the first and second light-emitting elements 200-1 and 200-2 may belong to the wavelength spectrum of the absorption spectrum of the photoelectric conversion layer 30 of the photodiode element 100, that is, the first wavelength spectrum W1, respectively. For example, the full widths at half maximum (hereafter referred to as a "FWHM4" and "FWHM5") of the emission spectra of first and second light-emitting elements 200-1 and 200-2 may be narrower than the FWHM1 of the absorption spectrum of the photoelectric conversion layer 30 of the photodiode element 100, respectively. For example, the FWHM4 and FWHM5 of the emission spectra of the first and second light-emitting elements 200-1 and 200-2 may be about 0.10 to about 0.50 relative to the FWHM1 of the absorption spectrum of the photoelectric conversion layer 30 of the photodiode element 100, respectively, and within the above range, about 0.10 to about 0.40, or about 0.10 to about 0.30. For example, the fourth wavelength spectrum W4 may be a green wavelength spectrum, the fifth wavelength spectrum W5 may be a red wavelength spectrum, and the first wavelength spectrum W1 may be a visible light wavelength spectrum. The green light-emitting element and the red/infrared light-emitting element may be used, for example, for absorption and/or reflection characteristics of oxyhemoglobin $HbO_2$ and/or hemoglobin Hb in blood vessels.

The aforementioned biosensor 300 may be applied to various devices for detecting biometric information, for example, one or more of a wearable device such as a wearable bioelectronic device; a skin-like device; or smart clothing to obtain a biosignal temporarily or in real time, but is not limited thereto. The device may be, for example, a patch-type skin-attachable device and/or a band-type skin-attachable device.

For example, the device may include a photoplethysmography PPG sensor device, an electroencephalogram EEG sensor device, an electrocardiogram ECG sensor device, a blood pressure BP sensor device, an electromyography EMG sensor device, a blood glucose BG sensor device, an accelerometer device, an RFID antenna device, an inertial sensor device, an activity sensor device, a strain sensor device, a motion sensor device, or a combination thereof, but is not limited thereto.

As an example, the photodiode element 100 may be applied to an image sensor.

Figure 13:
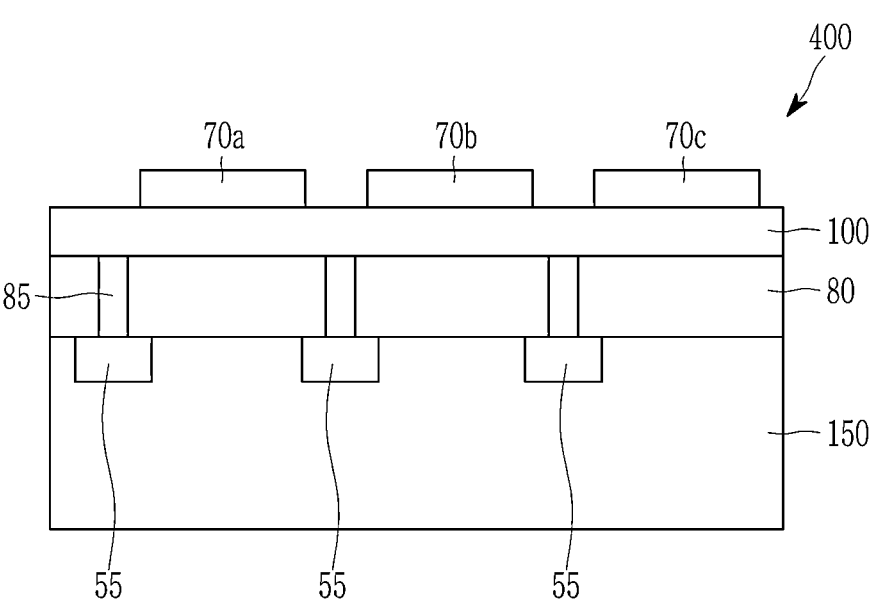
FIG. 13 is a cross-sectional view showing an example of an image sensor according to some example embodiments.

FIG. 13 is a cross-sectional view showing an example of an image sensor according to some example embodiments.

Referring to FIG. 13, an image sensor 400 according to some example embodiments includes a semiconductor substrate 150, an insulating layer 80, a photodiode element 100, and color filters 70a, 70b, and 70c.

The semiconductor substrate 150 may be or may include a silicon substrate, and a transmission transistor (not shown) and a charge storage 55 are integrated therein. The charge storage 55 may be integrated for each pixel. The charge storage 55 may be electrically connected to the photodiode element 100, and information of the charge storage 55 may be transferred by a transmission transistor.

Metal wires (not shown) and pads (not shown) may be formed on an upper portion or a lower portion of the semiconductor substrate 150. In order to decrease signal delay, the metal wires and pads may be made of a metal having low resistivity, for example, one or more of aluminum (Al), copper (Cu), silver (Ag), and alloys thereof, but are not limited thereto. However, example embodiments are not limited to the above structure, and metal wires and pads may be disposed on the lower portion of the semiconductor substrate 150.

The insulating layer 80 is formed on the semiconductor substrate 150. The insulating layer 80 may be made of an inorganic insulating material such as a silicon oxide and/or a silicon nitride, or a low dielectric constant (low K) material such as SiC, SiCOH, SiCO, and SiOF. The insulating layer 80 has a trench 85 exposing the charge storage 55. The trench 85 may be filled with a filler.

The aforementioned photodiode element 100 may be formed on the insulating layer 80. The structure and description of the photodiode element 100 are the same as described above. One of the first electrode 10 or the second electrode 20 of the photodiode element 100 may be a light-receiving electrode, and the other may be electrically connected to the charge storage 55. The photoelectric conversion layer 30 of the photodiode element 100 may be configured to absorb, for example, light in a visible light wavelength spectrum, and the light-emitting layer 40 of the photodiode element 100 may be configured to emit light in the visible light wavelength spectrum. When the first electrode 10 of the photodiode element 100 is a light-receiving electrode, the first electrode 10 may be at a side of the color filters 70a, 70b, and 70c, and the second electrode 20 may be at a side of the semiconductor substrate 150. The photodiode element 100 may be arranged along rows and/or columns on the semiconductor substrate 150, for example, in a matrix form.

The color filters 70a, 70b, and 70c may be on the photodiode element 100. The color filters 70a, 70b, and 70c may be configured to transmit light of different wavelength spectra from each other, and may be configured to absorb and/or reflect light of other wavelength spectra. For example, each of the color filters 70a, 70b, and 70c may be one of a red filter, a green filter, a blue filter, a cyan filter, a magenta filter, and a yellow filter (e.g., portions of a Bayer pattern).

For example, when the color filter 70a is a red filter, the photodiode element 100 overlapped with or under the color filter 70a may be configured to absorb light of a red wavelength spectrum and may be configured to photoelectrically convert the absorbed light of a red wavelength spectrum. For example, when the color filter 70b is a green filter, the photodiode element 100 overlapped with the color filter 70b may be configured to absorb light of a green wavelength spectrum and may be configured to photoelectrically convert the absorbed light of a green wavelength spectrum. For example, when the color filter 70c is a blue filter, the photodiode element 100 overlapped with the color filter 70c may be configured to absorb light in the blue wavelength spectrum and may be configured to electrically convert the absorbed light in the blue wavelength spectrum.

Figure 14:
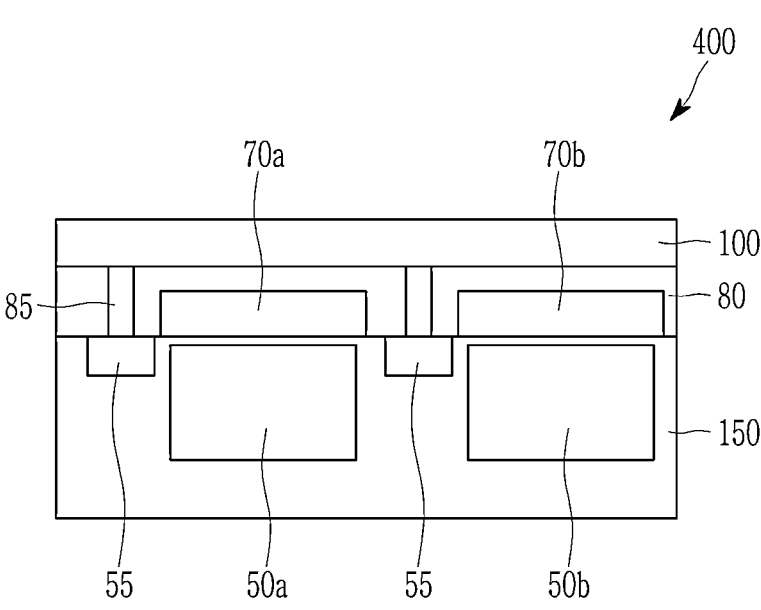
FIG. 14 is a cross-sectional view showing another example of an image sensor according to some example embodiments.

FIG. 14 is a cross-sectional view showing another example of an image sensor according to some example embodiments.

Referring to FIG. 14, the image sensor 400 according to the present example embodiment includes a semiconductor substrate 150, an insulating layer 80, a photodiode element 100, and color filters 70a, 70b, and 70c.

In the semiconductor substrate 150, photodiodes 50a and 50b, a transfer transistor (not shown), and a charge storage 55 are integrated. The photodiodes 50a and 50b may be to be overlapped with or under color filters 70a and 70b to be described later, and the charge storage 55 may be electrically connected to the photodiode element 100.

The color filters 70a and 70b may be formed on the insulating layer 80. The color filters 70a and 70b may be configured to selectively transmit light in a wavelength spectrum different from the absorption wavelength spectrum of the photodiode element 100. For example, the photodiode element 100 may be a green photoelectric conversion element configured to selectively absorb light in a green wavelength spectrum, the color filter 70a may be a red filter configured to selectively transmit light in a red wavelength spectrum, and the color filter 70b may be a blue filter configured to selectively transmit light in a blue wavelength spectrum. Light passing through the color filter 70a (e.g., light in the red wavelength spectrum) may be absorbed by the photodiode 50a in the semiconductor substrate 150 to photoelectrically convert the light in the red wavelength spectrum. Light passing through the color filter 70b (e.g., light in the blue wavelength spectrum) may be absorbed by the photodiode 50b in the semiconductor substrate 150 to photoelectrically convert the light in the blue wavelength spectrum.

The photoelectric conversion layer 30 of the photodiode element 100 may be configured to selectively absorb, for example, light in the green wavelength spectrum and may be configured to photoelectrically convert the absorbed light in the green wavelength spectrum. The emission spectrum of the light-emitting layer 40 of the photodiode element 100 may be at least partially overlapped with the absorption spectrum of the photoelectric conversion layer 30 as described above, and for example, emission spectrum of the light-emitting layer 40 of the photodiode element 100 may also belong to the green wavelength spectrum. The light of the green wavelength spectrum emitted from the light-emitting layer 40 may be absorbed by the photoelectric conversion layer 30, and the details are the same as described above. One of the first electrode 10 or the second electrode 20 of the photodiode element 100 may be a light-receiving electrode, and the other may be electrically connected to the charge storage 55.

For example, the photodiode element 100 may be applied to an infrared sensor.

Figure 15:
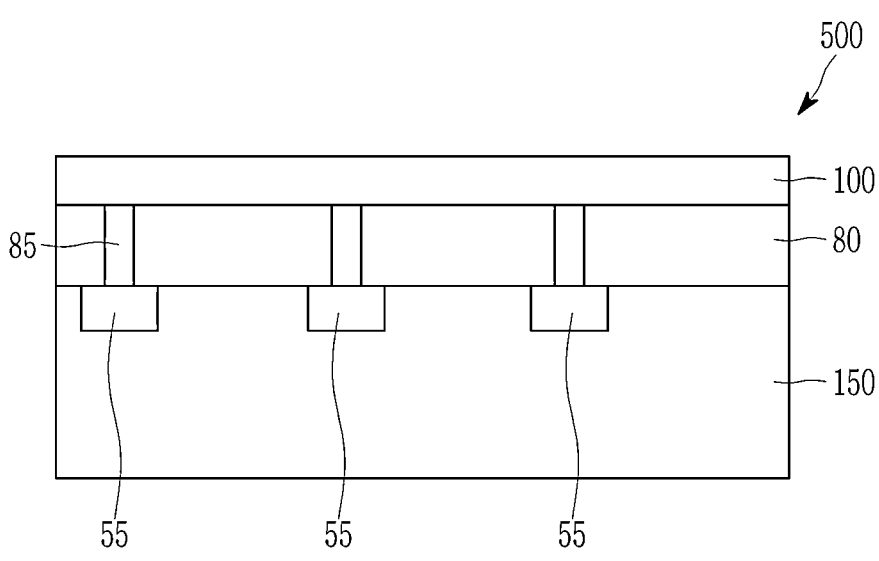
FIG. 15 is a cross-sectional view showing an example of an infrared sensor according to some example embodiments.

FIG. 15 is a cross-sectional view showing an example of an infrared sensor according to some example embodiments.

Referring to FIG. 15, an infrared sensor 500 according to some example embodiments includes a semiconductor substrate 150, an insulating layer 80, and a photodiode element 100.

The semiconductor substrate 150 and the insulating layer 80 are the same as described above.

The structure and descriptions of the photodiode element 100 are the same as described above, and the photoelectric conversion layer 30 of the photodiode element 100 may be configured to absorb light in at least a portion of the infrared wavelength spectrum and convert the absorbed light into an electrical signal. The photoelectric conversion layer 30 may include an infrared absorbing material capable of performing photoelectric conversion by selectively absorbing at least a portion of light in an infrared wavelength spectrum, and the infrared absorbing material may be a p-type semiconductor and/or an n-type semiconductor. The infrared absorbing material may be or may include, for example, an organic material, an inorganic material, an organic-inorganic material, or a combination thereof. The emission spectrum of the light-emitting layer 40 of the photodiode element 100 may be at least partially overlapped with the absorption spectrum of the photoelectric conversion layer 30 as described above, and for example, the emission spectrum of the light-emitting layer 40 of the photodiode element 100 may also belong to the infrared wavelength spectrum. Light in the infrared wavelength spectrum emitted from the light-emitting layer 40 may be absorbed by the photoelectric conversion layer 30, and the details are the same as described above. One of the first electrode 10 or the second electrode 20 of the photodiode element 100 may be a light-receiving electrode, and the other may be electrically connected to the charge storage 55.

The aforementioned biosensor 300, image sensor 400, or infrared sensor 500 may be included in various electronic devices. For example, they may be applied to electronic devices such as a mobile phone, a digital camera, a display device, a biometric recognition device, a security device, a medical device, and/or automobile electronic parts, but are not limited thereto.

Hereinafter, the example embodiments are illustrated in more detail with reference to examples. However, these examples are exemplary, and the scope of claims is not limited thereto.

Manufacture of Photodiode Elements

EXAMPLE 1

ITO is sputtered on a glass substrate to form a lower electrode. Then, zinc oxide (ZnO) is deposited on the lower electrode to form a 30 nm-thick lower charge auxiliary layer (HOMO: 7.4 eV, LUMO: 4.2 eV). Then, PTB7-Th (p-type semiconductor) and PC71BM (n-type semiconductor) are co-deposited to form a 120 nm-thick photoelectric conversion layer (HOMO: 5.25 eV, LUMO: 3.90 eV, absorption spectrum (first wavelength spectrum): about 800 nm, $\lambda_{peak,A}$=700 nm, FWHM1=350 nm), and HT211 (N-([1,1'-biphenyl]-4-yl)-9,9-dimethyl-N-(4-(9-phenyl-9H-carbazol-3-yl) phenyl)-9H-fluoren-2-amine) is deposited to form a 100 nm-thick intermediate charge auxiliary layer (HOMO: 5.5 eV, LUMO: 2.4 eV). Then, a host material and a dopant material are co-deposited on the intermediate charge auxiliary layer to form a 40 nm-thick light-emitting layer (HOMO: 6.1 eV, LUMO: 1.9 eV, emission spectrum (second wavelength spectrum): 480 nm to 700 nm, $\lambda_{peak,el}$=530 nm, FWHM2=65 nm). Then, ET204 and Liq are sequentially deposited on the light-emitting layer to form an upper charge auxiliary layer (HOMO: 6.2 eV, LUMO: 2.8 eV), and Al is deposited thereon to form an upper electrode, thereby manufacturing a photodiode element.

EXAMPLE 2

A photodiode element is manufactured in the same manner as in Example 1, except that the thickness of the photoelectric conversion layer is changed to 200 nm.

EXAMPLE 3

A photodiode element was manufactured in the same manner as in Example 1, except that the thickness of the photoelectric conversion layer is changed to 300 nm.

EXAMPLE 4

A photodiode element was manufactured in the same manner as in Example 1, except that the thickness of the photoelectric conversion layer is changed to 400 nm.

COMPARATIVE EXAMPLE 1

ITO is sputtered on a glass substrate to form a lower electrode. Then, zinc oxide (ZnO) is deposited on the lower electrode to form a 30 nm-thick lower charge auxiliary layer (HOMO: 7.4 eV, LUMO: 4.2 eV). Then, PTB7-Th (p-type semiconductor) and PC71BM (n-type semiconductor) are co-deposited to form a 120 nm-thick photoelectric conversion layer (HOMO: 5.25 eV, LUMO: 3.90 eV, absorption spectrum (first wavelength spectrum): about 800 nm, $\lambda_{peak,A}$=700 nm, FWHM=350 nm), and molybdenum oxide (MoO$_x$, 0<x≤3) is deposited thereon to form an upper charge auxiliary layer (HOMO: 8.6 eV, LUMO: 5.3 eV). Then, Al is deposited on the upper charge auxiliary layer to form an upper electrode, thereby manufacturing a photodiode element.

COMPARATIVE EXAMPLE 2

Figure 16:
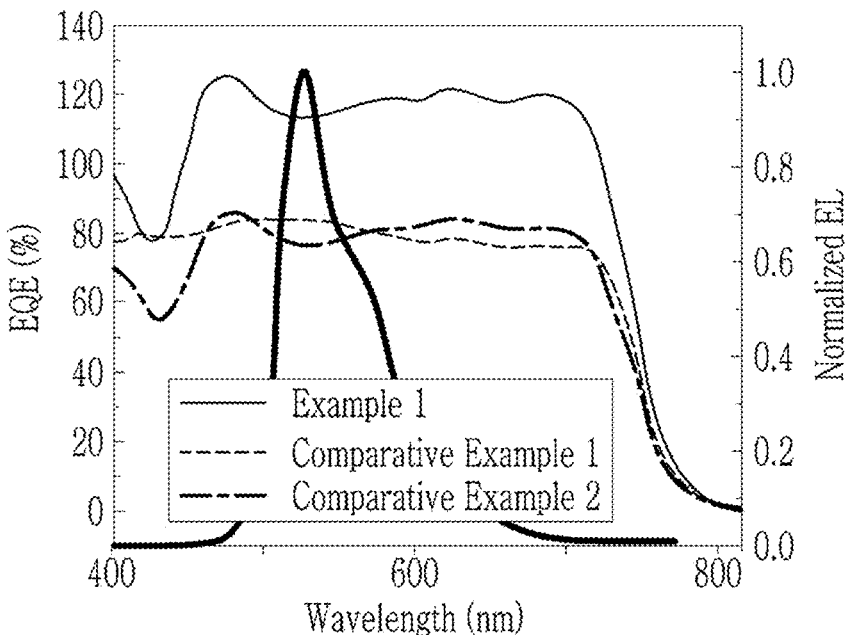
FIG. 16 is a graph showing the external quantum efficiency (EQE) according to the wavelength of the photodiode elements according to Example 1 and Comparative Examples 1 and 2.
Figure 17:
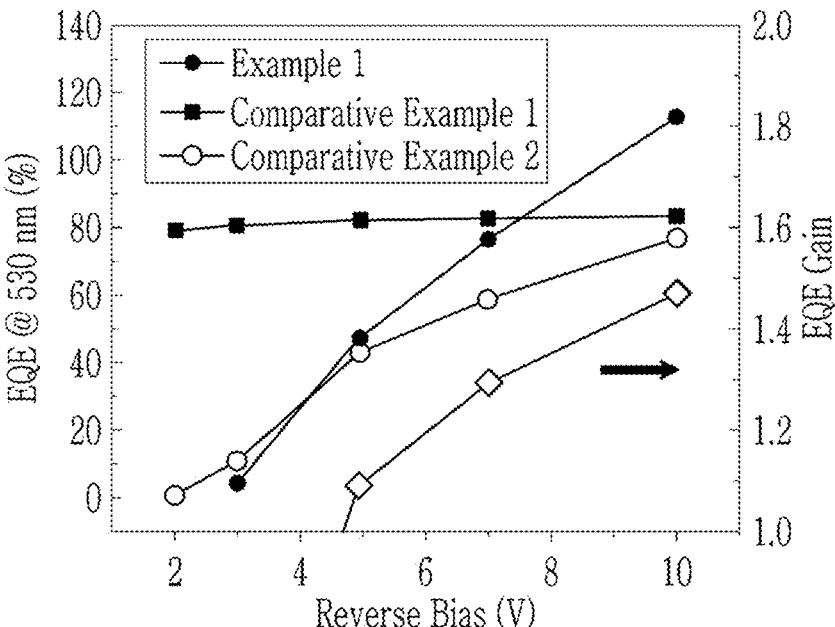
FIG. 17 is a graph showing changes in external quantum efficiency (EQE) according to bias of the photodiode elements according to Example 1 and Comparative Examples 1 and 2.

A photodiode element is manufactured in the same manner as in Example 1, except that the light-emitting layer is formed using the host material alone without the dopant material.
Evaluation I
The EQE according to the wavelength of the photodiode elements according to Example 1 and Comparative Examples 1 and 2 is evaluated.
FIG. 16 is a graph showing the EQE according to the wavelength of the photodiode elements according to Example 1 and Comparative Examples 1 and 2.
Referring to FIG. 16, the photodiode element according to Example 1 exhibits higher EQE in the same wavelength spectrum, than those of the photodiode elements according to Comparative Examples 1 and 2.
Evaluation II
The EQE according to the bias of the photodiode elements according to Examples and Comparative Examples is evaluated.
External quantum efficiency (EQE) is evaluated by the IPCE (Incident Photon to Current Efficiency) method in a wavelength spectrum of 380 nm to 800 nm while applying a reverse bias of 0 V to 10 V.
The result is shown in FIG. 17.
FIG. 17 is a graph showing changes in EQE according to bias of the photodiode elements according to Example 1 and Comparative Examples 1 and 2.

Referring to FIG. 17, the EQE of the photodiode element according to Example 1 changes according to the bias, unlike the photodiode element according to Comparative Example 1 which does not include a light-emitting layer and exhibits substantially increased EQE in proportion to the bias. In addition, the photodiode element according to Example 1 has an EQE of greater than 100%, unlike the photodiode element according to Comparative Example 1 which does not include a light-emitting layer or the photodiode element according to Comparative Example 2 which includes a light-emitting layer but does not emit light.

Figure 18:
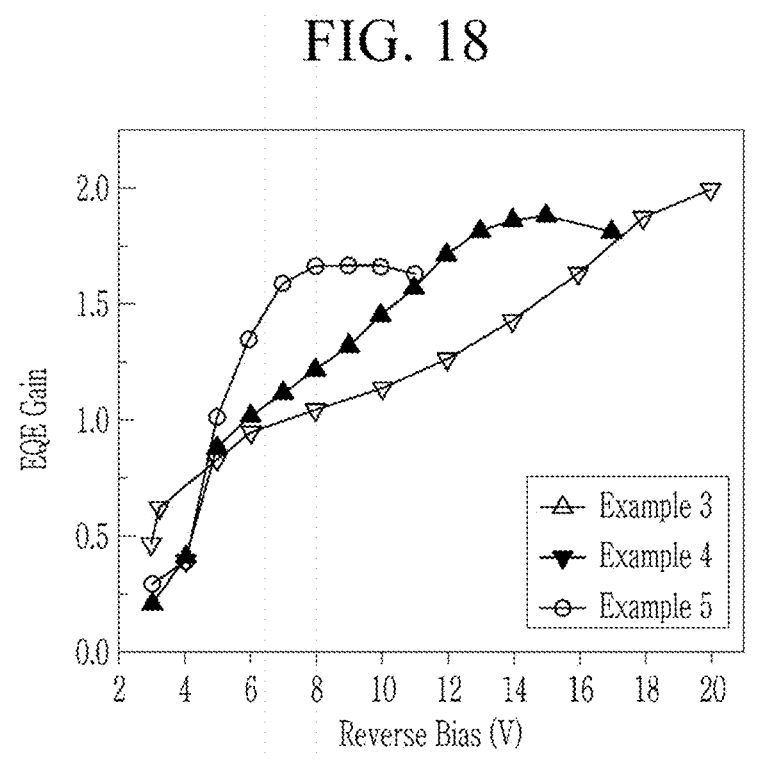
Figure 19:
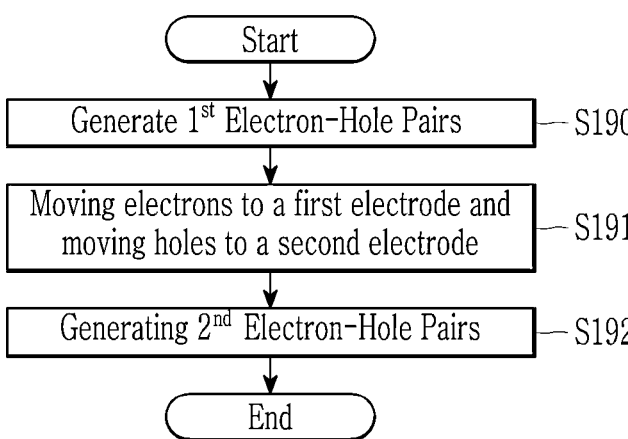
FIG. 19 is flowchart describing a method of operating a photodiode, according to some example embodiments.

In addition, EQE Gain represents a rate at which the EQE increased due to the light emission of the light-emitting layer, namely it may be defined as the EQE when the light-emitting layer emits light to the EQE when the light-emitting layer does not emit light. When the EQE Gain is 1, it indicates that there is no effect due to the emission of the light-emitting layer. Referring to FIG. 16, the photodiode element according to Example 1 exhibits an EQE Gain of about 1.5.
Evaluation III
EQE Gain according to the thickness of the photoelectric conversion layer of the photodiode element according to Examples is evaluated.
FIG. 18 is a graph showing EQE Gain according to bias of the photodiode elements according to Examples 2 to 4.
Referring to FIG. 18, as the thickness of the photoelectric conversion layer of the photodiode element increases, the EQE gain increases. For example, the photodiode element according to Example 4 exhibits an EQE gain of about 2.0 at 20 V, which may mean or indicate that the EQE is increased by about 2 times due to light emission. From this, as the thickness of the photoelectric conversion layer increases, more light emitted from the light-emitting layer is absorbed, thereby increasing the EQE Gain.
FIG. 19 is a flowchart describing a method of operating a photodiode, according to some example embodiments.
Referring to FIG. 19, in S190 the photodiode may generate first electron-hole pairs. For example, the photodiode may absorb light through a first electrode to have the light incident on a photoelectric conversion layer.
In S191, the generated electron-hole pairs may be separated. For example, the electrons may move to the first electrode, while the holes may move toward the light-emitting layer to be combined with the first electric charge injected from a second electrode to emit light.
In S192, light emitted from the light-emitting layer in the photoelectric conversion layer to additionally generate electron-hole pairs.
Additionally or alternatively, S191 and S192 may be repeated two or more times. A total number of charges (electrons and holes) generated may be greater than a number of incident photons.
When the terms "about" or "substantially" are used in this specification in connection with a numerical value, it is intended that the associated numerical value includes a manufacturing or operational tolerance (e.g., ±10%) around the stated numerical value. Moreover, when the words "generally" and "substantially" are used in connection with geometric shapes, it is intended that precision of the geometric shape is not required but that latitude for the shape is within the scope of the disclosure. Moreover, when the words "generally" and "substantially" are used in connection with material composition, it is intended that exactitude of the material is not required but that latitude for the material is within the scope of the disclosure.

Further, regardless of whether numerical values or shapes are modified as "about" or "substantially," it will be understood that these values and shapes should be construed as including a manufacturing or operational tolerance (e.g., ±10%) around the stated numerical values or shapes. Thus, while the term "same," "identical," or "equal" is used in description of example embodiments, it should be understood that some imprecisions may exist. Thus, when one element or one numerical value is referred to as being the same as another element or equal to another numerical value, it should be understood that an element or a numerical value is the same as another element or another numerical value within a desired manufacturing or operational tolerance range (e.g., ±10%).

While various example embodiments have been described, it is to be understood that example embodiments are not limited to the disclosed embodiments. For example, various modifications and/or equivalent arrangements included within the spirit and scope of the appended claims may be realized. Additionally example embodiments are not necessarily mutually exclusive with one another. For example, some example embodiments may include features described with reference to one or more figures, and may also include features described with reference to one or more other figures.

What is claimed is:

1. A photodiode element, comprising:
a first electrode;
a second electrode facing the first electrode;
a photoelectric conversion layer between the first electrode and the second electrode, an absorption spectrum of the photoelectric conversion layer corresponding to a first wavelength spectrum;
a light-emitting layer between the photoelectric conversion layer and the second electrode, an emission peak wavelength of the light-emitting layer being within the first wavelength spectrum; and
a first charge transport layer between the photoelectric conversion layer and the light-emitting layer,
wherein one of the first electrode or the second electrode is configured to operate an anode of the photodiode element and the other is configured to operate a cathode of the photodiode element, the anode and the cathode being a pair of electrodes configured to have a bias voltage applied, and
the photodiode element is a photoelectric conversion element configured to absorb light and convert the light into an electrical signal.

2. The photodiode element of claim 1, wherein,
an emission spectrum of the light-emitting layer corresponds to a second wavelength spectrum, and
the second wavelength spectrum overlaps with at least a portion of the first wavelength spectrum.

3. The photodiode element of claim 2, wherein a first full width at half maximum of the emission spectrum of the light-emitting layer is narrower than a second full width at half maximum of the absorption spectrum of the photoelectric conversion layer.

4. The photodiode element of claim 3, wherein the first full width at half maximum is greater than or equal to 0.10 times the second full width at half maximum and is less than or equal to 0.95 times the second full width at half maximum.

5. The photodiode element of claim 2, wherein the second wavelength spectrum overlaps with the first wavelength spectrum.

6. The photodiode element of claim 2, wherein each of the first wavelength spectrum and the second wavelength spectrum are in the visible light wavelength spectrum.

7. The photodiode element of claim 2, wherein each of the first wavelength spectrum and the second wavelength spectrum are in the infrared wavelength spectrum.

8. The photodiode element of claim 1, wherein an absorbance of the absorption spectrum at the emission peak wavelength is 50% to 100% of the maximum absorbance of the absorption spectrum.

9. The photodiode element of claim 1, further comprising:
a second charge transport layer between the first electrode and the photoelectric conversion layer; and
a third charge transport layer between the second electrode and the light-emitting layer.

10. The photodiode element of claim 9, wherein
the first charge transport layer includes a hole transport layer, and
the third charge transport layer includes an electron transport layer.

11. The photodiode element of claim 10, wherein the second charge transport layer includes a hole transport layer or includes an electron transport layer.

12. The photodiode element of claim 10, wherein the first electrode corresponds to an anode and the second electrode corresponds to a cathode.

13. The photodiode element of claim 9, wherein
the first charge transport layer includes an electron transport layer, and
the third charge transport layer includes a hole transport layer.

14. The photodiode element of claim 13, wherein the second charge transport layer includes a hole transport layer or includes an electron transport layer.

15. The photodiode element of claim 13, wherein the first electrode corresponds to a cathode and the second electrode corresponds to an anode.

16. The photodiode element of claim 1, wherein
the first electrode includes one or more of a transparent electrode or a semi-transmissive electrode, and
the second electrode includes one or more of a transparent electrode or a reflective electrode.

17. The photodiode element of claim 1, wherein an external quantum efficiency of the photodiode element is greater than 100%.

18. The photodiode element of claim 1, wherein as a bias between the first electrode and the second electrode increases, an external quantum efficiency of the photodiode element increases.

19. A sensor comprising the photodiode element of claim 1.

20. The sensor of claim 19, wherein the sensor includes at least one of an optical sensor, an image sensor, an infrared sensor, an ultraviolet sensor.

21. An electronic device comprising the photodiode element of claim 1.

22. A method of operating the photodiode element of claim 1, comprising:
a first process of absorbing light incident through the first electrode in the photoelectric conversion layer to generate electron-hole pairs;
a second process of moving a first electric charge, which is one of electrons and holes that are separated from the electron-hole pairs by a bias between the first electrode and the second electrode, the moving toward the first electrode, and moving a second electric charge, which is the other of electrons and holes that are separated from the electron-hole pairs, toward the light-emitting layer to be combined with the first electric charge injected from the second electrode to emit light,; and a third process of absorbing light emitted from the light-emitting layer in the photoelectric conversion layer to additionally generate electron-hole pairs.

23. The method of claim 22, wherein the second process and the third process are repeated two or more times.

24. The method of claim 22, wherein a number of charges generated by the photodiode element is greater than a number of photons of light incident through the first electrode.

25. A photodiode element, comprising a first electrode;

a second electrode facing the first electrode;

a photoelectric conversion layer between the first electrode and the second electrode, the photoelectric conversion layer comprising a light absorbing material; and a light-emitting layer between the photoelectric conversion layer and the second electrode, the light-emitting layer comprising a light-emitting material, wherein, as a bias between the first electrode and the second electrode increases, an external quantum efficiency of the photodiode element increases, and an external quantum efficiency of the photodiode element is greater than 100%.

26. The photodiode element of claim 25, wherein the photodiode element is configured to operate such that, electric charges that are photo-generated by the photoelectric conversion layer move to the light-emitting layer according to an application of a bias between the first electrode and the second electrode such that the light-emitting layer performs electroluminescence, and the photoelectric conversion layer is configured to absorb the light electroluminescent from the light-emitting layer to convert the absorbed light into an electrical signal.

27. The photodiode element of claim 25, wherein an absorption spectrum of the photoelectric conversion layer at least partially overlaps with an emission spectrum of the light electroluminescent from the light-emitting layer, and a first full width at half maximum of the emission spectrum is narrower than a second full width at half maximum of the absorption spectrum of the photoelectric conversion layer.

28. The photodiode element of claim 25, further comprising:

a first charge transport layer between the photoelectric conversion layer and the light-emitting layer.

29. The photodiode element of claim 28, further comprising:

a second charge transport layer between the first electrode and the photoelectric conversion layer; and a third charge transport layer between the second electrode and the light-emitting layer.

30. A sensor comprising the photodiode element of claim 25.

31. The sensor of claim 30, wherein the sensor includes at least one of an optical sensor, an image sensor, an infrared sensor, an ultraviolet sensor.

32. A photodiode element, comprising:

a photoelectric conversion layer, an absorption spectrum of the photoelectric conversion layer corresponding to a first wavelength spectrum having a first measure of statistical dispersion; and a light-emitting layer on the photoelectric conversion layer, an emission spectrum of the light-emitting layer corresponding to a second wavelength spectrum having a second measure of dispersion, the second measure of statistical dispersion less than the first measure of statistical dispersion.

33. The photodiode element of claim 32, wherein the photodiode element is configured to operate such that a number of charges generated by the photoelectric conversion layer is more than a number of photons incident to the photoelectric conversion layer.

34. The photodiode element of claim 33, wherein the first measure of statistical dispersion is a first full width at half maximum, and the second measure of statistical dispersion is a second full width at half maximum.

35. The photodiode element of claim 33, further comprising:

a first electrode; and a second electrode facing the first electrode, wherein the photoelectric conversion layer and the light-emitting layer are between the first electrode and the second electrode.

36. The photodiode element of claim 35, wherein one of the first electrode and the second electrode includes a transparent material, and the other of the first electrode and the second electrode includes a reflective material.

*    *    *    *    *